United States Patent
Chakraborty et al.

(10) Patent No.: US 11,736,091 B2
(45) Date of Patent: Aug. 22, 2023

(54) BASEBAND FILTER FOR CURRENT-MODE SIGNAL PATH

(71) Applicant: International Business Machines Corporation, Armonk, NY (US)

(72) Inventors: Sudipto Chakraborty, Plano, TX (US); Raymond Richetta, Rochester, MN (US); John Francis Bulzacchelli, Somers, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/555,998

(22) Filed: Dec. 20, 2021

(65) Prior Publication Data

US 2023/0198505 A1    Jun. 22, 2023

(51) Int. Cl.
  *H03H 7/12*        (2006.01)
  *H03H 11/04*       (2006.01)

(52) U.S. Cl.
  CPC ..... *H03H 11/0461* (2013.01); *H03H 11/0466* (2013.01)

(58) Field of Classification Search
  CPC .......... H03H 11/0461; H03H 11/0466; H03H 7/0107; H03H 7/0138; H03H 7/0153; H03H 7/0161; H03H 7/12; H03H 11/0405; H03H 11/0422; H03H 11/0472; H03H 2011/0488
  See application file for complete search history.

(56) References Cited

U.S. PATENT DOCUMENTS

| | | | |
|---|---|---|---|
| 8,781,411 B2 | 7/2014 | Asuri et al. |
| 9,160,309 B2 | 10/2015 | Rajendran et al. |
| 9,762,274 B2 | 9/2017 | Rai et al. |
| 9,893,692 B2 | 2/2018 | Soe et al. |

(Continued)

FOREIGN PATENT DOCUMENTS

CN        106100606 A    *  11/2016

OTHER PUBLICATIONS

Fischer, "Design of an Active Harmonic Rejection N-Path Filter for Highly Tunable RF Channel Selection," Master's Thesis, California Polytechnic State University, Jun. 2017, 97 pages.

(Continued)

*Primary Examiner* — Long Nguyen
(74) *Attorney, Agent, or Firm* — Amin, Turocy & Watson, LLP

(57) ABSTRACT

One or more systems, devices and/or methods of use provided herein relate to a baseband filter that can be used in a current-mode end-to-end signal path. The current-mode end-to-end signal path can include a digital to analog converter (DAC) operating in current-mode and an upconverting mixer, operating in current-mode and operatively coupled to the DAC. In one or more embodiments, a device used in the signal path can comprise a baseband filter that receives an input current and outputs an output current. The baseband filter can comprise a feedback loop component having an active circuit branch and a passive circuit branch coupled in a loop. A mirroring device can be coupled to the feedback loop component and can provide an output of the device. Selectively activating the mirroring device can vary gain, such as of the mirroring device.

25 Claims, 16 Drawing Sheets

(56) References Cited

U.S. PATENT DOCUMENTS

| | | | | |
|---|---|---|---|---|
| 2011/0012692 A1* | 1/2011 | Mirzaei | ............. | H03H 1/02 |
| | | | | 333/172 |
| 2011/0090824 A1* | 4/2011 | Khatibi | ............. | H03H 11/1213 |
| | | | | 370/278 |
| 2020/0395405 A1 | 12/2020 | Barends | | |
| 2021/0384896 A1 | 12/2021 | Mckay et al. | | |

OTHER PUBLICATIONS

Ratiu, "Continuous time signal processing for wake-up radios," Doctoral Thesis, Universit'e de Lyon, Oct. 8, 2015, 186 pages.

Mahattanakul et al., "Modular log-domain filters based upon linear Gm-C filter synthesis," IEEE Transactions on Circuits and Systems—I: Fundamental Theory and Applications, vol. 46, No. 12, Dec. 1999, 10 pages.

Li et al., "A 70-280 MHz frequency and Q tunable 53 dB SFDR Gm-C filter for ultra-wideband," IEEE Asian Solid-State Circuits Conference, Nov. 8-10, 2010, 4 pages.

Takura et al., "A 2.7-V, 200-kHz, 49-dBm, stopband-IIP3, low-noise, fully balanced gm-C filter IC," IEEE Journal of Solid-State Circuits, vol. 34, No. 8, Aug. 1999, 5 pages.

Gambhir et al., "A low power 1.3GHz dual-path current mode Gm-C filter," IEEE 2008 Custom Intergrated Circuits Conference (CICC), 4 pages.

Voorman et al., "Tunable High-Frequency Gm-C Filters," IEEE Journal of Solid-State Circuits, vol. 35, No. 8, Aug. 2000, 12 pages.

Chakraborty et al. ,"Current Mode Signal Path of an Integrated Radio Frequency Pulse Generator," U.S. Appl. No. 17/354,718, filed Jun. 22, 2021, 45 pages.

Chakraborty et al., "Current Mode Transconductance Capacitance Filter Within a Radio Frequency Digital to Analog Converter," U.S. Appl. No. 16/952,723, filed Nov. 19, 2020, 49 pages.

Mell et al., "The NIST Definition of Cloud Computing," Recommendations of the National Institute of Standards and Technology, NIST Special Publication 800-145, Sep. 2011, 7 pages.

Wan Dijk et al., "A Scalable Cryo-CMOS Controller for the Wideband Frequency-Multiplexed Control of Spin Qubits and Transmons," IEEE Journal of Solid-State Circuits, vol. 55, No. 11, Nov. 2020, 17 pages.

International Search Report and Written Opinion received for PCT Application Serial No. PCT/EP2022/085633 dated Apr. 13, 2023, 14 pages.

Mi et al., "Short Paper: Device-and Locality-Specific Fingerprinting of Shared NISQ Quantum Computers", Proceedings of The 17th Acm Workshop on Mobility In The Evolving Internet Architecture, Oct. 18, 2021, 5 pages.

Zajac et al., "Spectator Errors in Tunable Coupling Architectures", IBM Quantum, Aug. 25, 2021, 5 pages.

Kounalakis Marios, "Nonlinear Couplings for Quantum Control of Superconducting Qubits and Electrical/Mechanical Resonators", Dec. 19, 2019, 164 pages.

Mundada et al., "Suppression of Qubit Crosstalk in a Tunable Coupling Superconducting Circuit", Physical Review Applied, vol. 12, No. 5, May 31, 2019, 11 pages.

\* cited by examiner

BASEBAND FILTER FOR CURRENT-MODE SIGNAL PATH

FIELD OF USE

The present disclosure relates generally to an integrated radio frequency pulse generator system utilizing a current-mode end-to-end signal path, and more particularly to a baseband filter for use in such system.

BACKGROUND

Quantum computing is generally the use of quantum-mechanical phenomena to perform computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1. Quantum computing has the potential to solve problems that, due to computational complexity, cannot be solved or can only be solved slowly on a classical computer.

SUMMARY

The following presents a summary to provide a basic understanding of one or more embodiments of the invention. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products can facilitate an integrated radio frequency pulse generator system, such as utilizing a current-mode end-to-end signal path to reduce power consumption and enhance linearity between a digital to analog converter (DAC) and subsequent stages in a signal chain. This can facilitate realization of a favorable set of trade-offs regarding power consumption and distortion. The one or more advantages can be provided, at least in part, by utilizing a baseband filter comprising a feedback loop component having a loop-coupled active circuit branch and passive circuit branch.

In accordance with an embodiment, a device can comprise a baseband filter that receives an input current and outputs an output current. The baseband filter can comprise a feedback loop component having an active circuit branch and a passive circuit branch coupled in a loop.

In accordance with another embodiment, a system can comprise a radio frequency (RF) pulse generator comprising a baseband filter that receives an input current and provides an output current, wherein the baseband filter comprises a feedback loop component having an active circuit branch and a passive circuit branch coupled in a loop. The RF pulse generator also can comprise an output stage coupled to the baseband filter.

In accordance with yet another embodiment, a method can comprise outputting, by a system operatively coupled to a processor, an output current by a baseband filter that receives an input current, the baseband filter comprising a feedback loop component having an active circuit branch and a passive circuit branch coupled in a loop.

An advantage of the aforementioned device, system and/or method can be enablement of a current-mode signal path, which can provide a path to current reuse between the baseband filter and adjacent stages in the signal chain. Due to the use of a passive circuit branch that consumes little or no static power, employing the aforementioned feedback loop can reduce current use. Adopting a current-mode signal path limits undesirable distortion products by avoiding introduction of additional current-to-voltage and voltage-to-current conversions in the respective signal path. Furthermore, construction and function of the baseband filter can align with low impedance at various circuit interfaces of a respective signal path and/or RF pulse generator, which enhances both linearity and circuit bandwidth. In connection therewith, current can be reused, power efficiency can be improved, and distortion products can be reduced, relative to a signal chain employing the baseband filter. Another advantage of current mode filters can be that linear functions such as addition and subtraction can be accomplished by dotting the outputs of circuits together, a technique which is power-efficient and compatible with low supply voltages.

A benefit of the aforementioned advantages can be an ability to employ less power relative to operating one or more qubits of a quantum system. Reduced power consumption can allow for increased scaling of qubits of a quantum system. Furthermore, the components of the device and/or system can be employed within and/or relative to a cryogenic chamber, such as a dilution refrigerator.

In one or more embodiments of the aforementioned device, system and/or method, a mirroring device can be coupled to the feedback loop component and can provide an output of the device. In one or more embodiments of the aforementioned device, system and/or method, selectively activating the mirroring device can vary gain, such as by varying the active width (e.g., number of active fingers) of the mirroring device. A related advantage can be an ability to realize an additional pole by using a resistor and capacitor coupled between the loop and the output stage. The poles can be made to track each other by designing the circuit so that the product of the transconductance (gm) and the resistor (R) remains a constant quantity.

In accordance with still another embodiment, a device can comprise a baseband filter that outputs an output current based on an input current. The baseband filter can comprise a first transistor having source, gate and drains, wherein the source is coupled to an input terminal, wherein the gate is coupled to a bias voltage, wherein the drain is coupled to a capacitance source, and wherein the capacitance source provides a first pole, a second transistor, and a passive branch that couples the drain of the first transistor to a gate of the second transistor, wherein the passive branch provides a second pole.

An advantage of the aforementioned device, system and/or method can be enablement of a current-mode signal path, which can provide a path to current reuse between the baseband filter and adjacent stages in the signal chain. Due to the use of a passive circuit branch that consumes little or no static power, employing the aforementioned feedback loop can reduce current use. Adopting a current-mode signal path limits undesirable distortion products by avoiding introduction of additional current-to-voltage and voltage-to-current conversions in the respective signal path. Furthermore, construction and function of the baseband filter can align with low impedance at various circuit interfaces of a respective signal path and/or RF pulse generator, which enhances both linearity and circuit bandwidth. In connection therewith, current can be reused, power efficiency can be improved, and distortion products can be reduced, relative to a signal chain employing the baseband filter. Another advantage of current mode filters can be that linear functions such as addition and subtraction can be accomplished by dotting the outputs of circuits together, a technique which is power-efficient and compatible with low supply voltages.

In an embodiment of the device, a source of the second transistor can be coupled to ground or to a power supply, and a drain of the second transistor can be coupled to the input terminal. An advantage can be provision of the first and second poles, while employing a passive circuit branch.

In accordance with another embodiment, a method can comprise varying gain, by a mirroring device, of a digital to analog converter by selectively activating one or more of a plurality of mirroring sub-units of the mirroring device. The method can comprise outputting, by the mirroring device, an output current, wherein the mirroring device provides an output of a current-mode signal path of a baseband filter. The method can comprise receiving, by the mirroring device, voltage from a feedback loop comprising both active and passive circuit branches of the baseband filter.

An advantage of the aforementioned device, system and/or method can be enablement of a current-mode signal path, which can provide a path to current reuse between the baseband filter and adjacent stages in the signal chain. Due to the use of a passive circuit branch that consumes little or no static power, employing the aforementioned feedback loop can reduce current use. Adopting a current-mode signal path limits undesirable distortion products by avoiding introduction of additional current-to-voltage and voltage-to-current conversions in the respective signal path. Furthermore, construction and function of the baseband filter can align with low impedance at various circuit interfaces of a respective signal path and/or RF pulse generator, which enhances both linearity and circuit bandwidth. In connection therewith, current can be reused, power efficiency can be improved, and distortion products can be reduced, relative to a signal chain employing the baseband filter. Another advantage of current mode filters can be that linear functions such as addition and subtraction can be accomplished by dotting the outputs of circuits together, a technique which is power-efficient and compatible with low supply voltages.

A benefit of the aforementioned advantages can be an ability to employ less power relative to operating one or more qubits of a quantum system. Reduced power consumption can allow for increased scaling of qubits of a quantum system. Furthermore, the components of the device and/or system can be employed within and/or relative to a cryogenic chamber, such as a dilution refrigerator.

DETAILED DESCRIPTION

Figure 1:
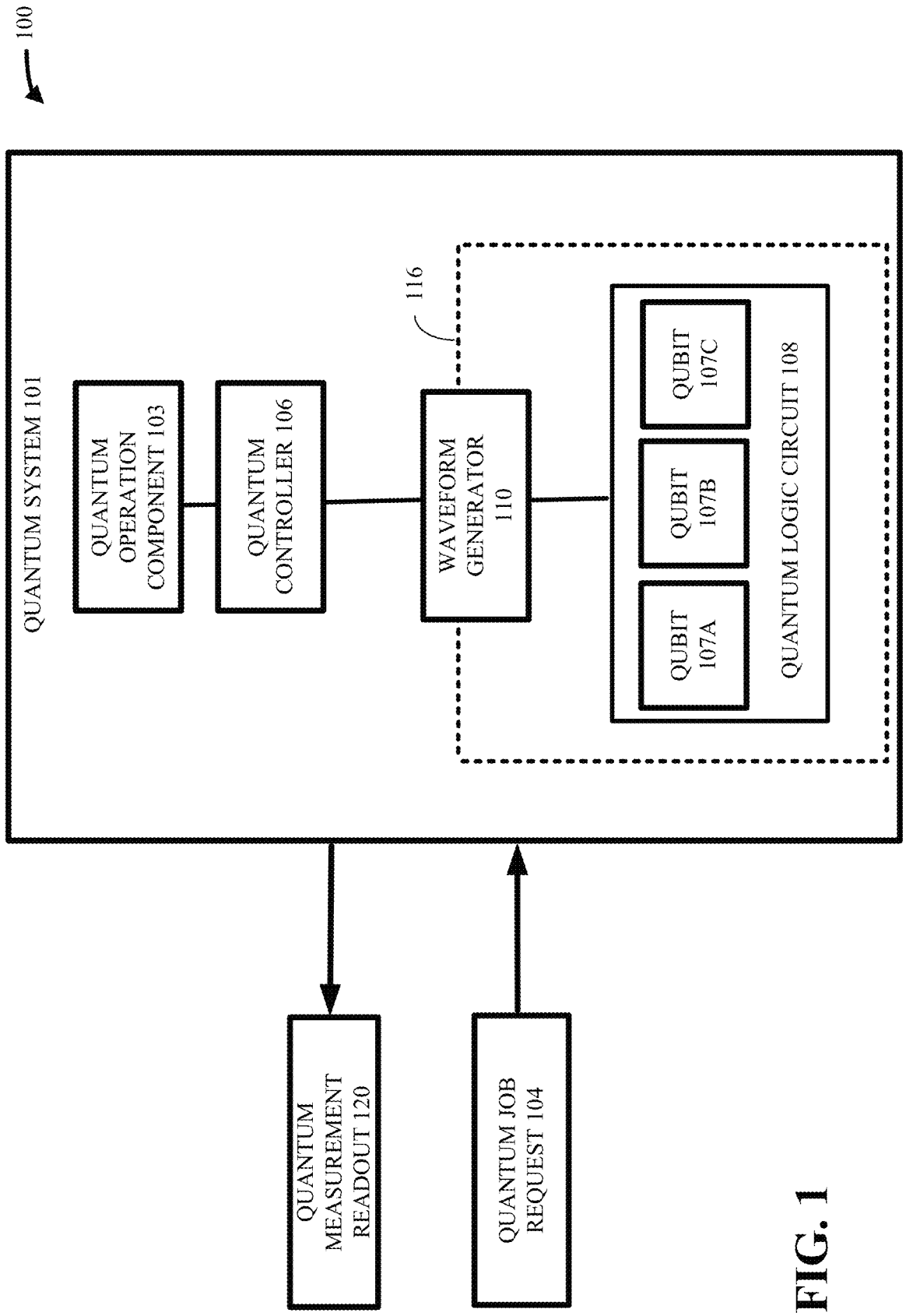
FIG. 1 illustrates a block diagram of an example, non-limiting system that can facilitate operation of one or more qubits, in accordance with one or more embodiments described herein.

The subject embodiments described herein generally relate to an integrated radio frequency (RF) pulse generator and more specifically, to utilizing a current-mode end-to-end signal path to reduce power consumption, reduce distortion and enhance linearity between a digital to analog converter (DAC) and adjacent stages in a signal chain. More specifically, the subject embodiments described herein relate to a power-efficient current-mode baseband filter, which can be used in various systems, with or without a pulse generator and/or DAC.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Generally, on a large scale, quantum computing cloud service providers can execute millions of quantum jobs for users during a year. Each quantum job can include the execution of one or more quantum programs. Where qubit states only can exist (or can only be coherent) for a limited amount of time, an objective of operation of a quantum logic circuit (e.g., including one or more qubits) can be to reduce the time of the operation and/or increase the speed of the operation. Time spent to operate the quantum logic circuit can undesirably reduce the available time of operation on one or more qubits. This can be due to the available coherence time of the one or more qubits prior to decoherence of the one or more qubits. For example, a qubit state can be lost in less than 100 to 200 microseconds in some cases. Further, operations on qubits generally introduce some error, such as some level of decoherence and/or some level of quantum noise, further affecting qubit availability. Quantum noise can refer to noise attributable to the discrete and/or probabilistic natures of quantum interactions. Device designs that prolong the lifetime of the quantum state and extend the coherence time can be desirable.

Also, on the large scale, a large quantity of quantum jobs can create pressure to execute the respective quantum programs quickly. That is, increased speed of execution can directly and/or indirectly correlate to maximizing system usage, minimizing users having to wait for measurement results, and/or minimizing undesirable consuming of classical computational resources. Pressure also can be created to execute these quantum jobs well, so that a maximum performance can be extracted from near-term error-prone systems, so that a quality of measurements relative to the one or more qubits of the respective quantum systems and/or so that compiling into physical-level pulses can be improved (e.g., related to accuracy, precision and/or measurement efficiency).

Physical, real-world, quantum logic circuits controlled by a quantum system can include a plurality of qubits. One type of qubit, a superconducting qubit, can include a Josephson junction, and operates generally only within a cryogenic chamber, such as a dilution refrigerator. One or more such superconducting qubits can be multiplexed per measurement circuit contained within the cryogenic chamber.

Arbitrary waveform generation capability with variable amplitude and low distortion can be desirable in multiple contexts, including in control of qubits. A key circuit in an arbitrary waveform generator (AWG) can be a digital to analog converter (DAC), which can be valuable in a variety of applications, including wireless transmitters and implementing qubit control pulses. Minimizing power consumption and reducing distortion for such designs can be valuable, especially in context of cryogenic signal generation for qubit control. Challenges with designs that utilize voltage mode representations for a signal path can include high dynamic range requirements at block interfaces, leading to non-linear behavior and the generation of undesired distortion products. Undesired distortion products can be considered a source of noise or disturbances in the system, and thus can contribute to reducing the coherence time of one or more qubits in the cryogenic chamber, for example.

Another challenge can be significant power consumption per block, with no opportunity for power efficiency that comes from current reuse. When scaling a quantum system to include an increased number of qubits, power efficiency can be not only desirable, but also a factor enabling the scaling to include the increased number of qubits.

More particularly, quantum computation utilizes a qubit as its essential unit instead of a classical computing bit. A qubit (e.g., quantum binary digit) is a quantum-mechanical analog of a classical bit. Whereas classical bits can employ only one of two basis states (e.g., 0 or 1), qubits can employ superpositions of those basis states (e.g., $\alpha|0>+\beta|1>$, where $\alpha$ and $\beta$ are complex scalars (such that $|\alpha|^2+|\beta|^2=1$), allowing several qubits to theoretically hold exponentially more information than the same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, or similar binary-type state measure. Qubits, partaking of the quantum mystique, can occupy a superposition of 0 and 1 states. It is not that the qubit can have an intermediate value, such as 0.63; when the state of the qubit is measured, the result is either 0 or 1. But in the course of a computation, a qubit can act as if it were a mixture of states—for example: 63 percent 0 and 37 percent 1.

Indeed, general quantum programs require coordination of quantum and classical parts of a computation. One way to contemplate general quantum programs is to identify processes and abstractions involved in specifying a quantum algorithm, transforming the algorithm into executable form, running an experiment or simulation, and analyzing the results. A notion throughout these processes is use of intermediate representations. An intermediate representation (IR) of computation is neither its source language description nor target machine instructions, but something in between. Compilers can utilize several IRs during a process of translating and optimizing a program. An input is a source code describing a quantum algorithm and compile time parameter(s). An output is a combined quantum/classical program expressed using a high-level IR. A distinction between quantum and classical computers is that the quantum computer is probabilistic, thus measurements of algorithmic outputs provide a proper solution within an algorithm specific confidence interval. Computation is repeated until a satisfactory probable certainty of solution can be achieved.

By processing information using laws of quantum mechanics, quantum computers offer novel ways to perform computation tasks such as molecular calculations, optical photons, optimization, and many more. Many algorithms and system components are introduced to perform such computational tasks efficiently. For example, radio frequency (RF) pulse generators (often incorporating one or more digital to analog converters) can be valuable in a variety of applications, including wireless transmitters and implementing control pulses for qubits. There can be one or more challenges with designs that utilize voltage mode representations for a signal path which include high dynamic range requirements at block interfaces, leading to nonlinear behavior and generation of higher amplitude distortion products. Another challenge can be significant power consumption per block, with no opportunity for power efficiency that comes from current reuse. Thus, embodiments herein propose a baseband filter for use in a current-mode end-to-end signal path to facilitate realization of a favorable set of trade-offs regarding power consumption and distortion. These benefits can be best achieved by implementing the entire chain in current-mode.

The embodiments described herein relate generally to RF pulse generator systems and methods that implement a current-mode end-to-end signal path from a digital to analog converter (DAC) through an output which enables realization of a favorable set of trade-offs regarding power consumption and distortion. Elements of a signal path of the device can be a DAC, baseband filter, mixer, attenuator, and an output chain component. Benefits can be achieved by implementing an entire chain in current-mode. Embodiments can optionally utilize radio frequency digital to analog converters (RFDACs).

Current-mode signal processing is well suited for low distortion applications, as it can reduce voltage swings at various nodes of interest of an employed device, circuit and/or signal path. Another benefit of current-mode circuits is that they can make possible current reuse, in which the bias and signal currents of one stage are shared with another stage (typically by stacking the circuit stages). Since reuse can decrease the total current drawn from the power supply, circuit power efficiency can be improved. Traditional current-mode input filters using an operational amplifier consume significant amount of power and have limitations to high frequency applications. While introducing a current-mode signal path design in implementation of an integrated RF pulse generator can improve the circuit power efficiency, one or more embodiments described herein provide an improved baseband filter design that can further improve circuit power efficiency.

That is, implementing an efficient current-mode filter stage can be a key part of realizing a proposed end-to-end current-mode signal path, which has been developed for low-power consumption through leverage of current reuse and enhancing end-to-end linearity by minimizing voltage-to-current and current-to-voltage conversion. Low output signal can be a design construction that can be an advantage to a system in implementing a signal chain efficiently.

To achieve current reuse in such signal path, a baseband filter, such as a continuous time baseband filter, can be employed that receives an input current and provides an output current. Internal feedback mechanisms of the baseband filter can be carried out as a combination of current to voltage and voltage to current conversions. A feedback loop of the internal feedback mechanisms can use at least one active circuit branch and at least one passive circuit branch. The passive circuit branch is a circuit branch that consumes little or no static power. This design can provide for two poles separable in frequency, which can provide for stability of the feedback mechanisms. Related biasing can provide substantially constant separation between the poles, such as to maintain a desired phase margin.

The feedback loop can use a mirroring device to mirror filtered current to an output of the baseband filter. The mirroring device can include one or more sub-units (e.g., mirroring portions) coupled to one another. By changing mirroring ratio of the mirroring device, a variable gain can be achieved with respect to a fine baseline step.

An additional pole can be realized between the filter core stage, having the feedback loop, and the mirroring stage, having the mirroring device. This additional pole can be realized by one or more non-static power consuming circuit elements, such as comprising a resistor and a capacitor. The provision of the additional pole can allow for the respective baseband filter to achieve higher order filtering, than without the additional pole, without compromising stability of the baseband filter. The additional pole further does not create distortion, and thus does not lessen one or more advantages of the filter core stage.

An output from the baseband filter can be a current, which can be an input to another baseband filter stage. Therefore, multiple such baseband filters can be cascaded to realize higher order current mode filters. In such cascaded systems, each filter can provide low-pass characteristics, with corner frequencies, quality factors and gain steps being set by a digital controller.

One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous specific details are set forth in order to provide a more thorough understanding of the one or more embodiments. It is evident, however, in various cases, that the one or more embodiments can be practiced without these specific details.

Further, embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems described herein, such as non-limiting system 100 as illustrated at FIG. 1, and/or systems thereof, can further comprise, be associated with and/or be coupled to one or more computer and/or computing-based elements described herein with reference to an operating environment, such as the operating environment 1400 illustrated at FIG. 14. In one or more described embodiments, computer and/or computing-based elements can be used in connection with implementing one or more of the systems, devices, components and/or computer-implemented operations shown and/or described in connection with FIG. 1 and/or with other figures described herein.

Turning first generally to FIG. 1, one or more embodiments described herein can include one or more devices, systems and/or apparatuses that can facilitate executing one or more quantum operations to facilitate output of one or more quantum results. For example, FIG. 1 illustrates a block diagram of an example, non-limiting system 100 that can enhance execution of a quantum job, such as by enhancing power consumption relative to arbitrary waveform generation relative to the quantum job.

The quantum system 101 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 120, can be responsive to the quantum job request 104 and associated input data and can be based at least in part on the input data, quantum functions and/or quantum computations.

In one or more embodiments, the quantum system 101 can comprise one or more quantum components, such as a quantum operation component 103, a quantum controller 106, a waveform generator 110, and a quantum logic circuit 108 comprising one or more qubits (e.g., qubits 107A, 107B and/or 107C), also referred to herein as qubit devices 107A, 107B and 107C.

The quantum controller 106 can comprise any suitable processor. The quantum controller 106 can generate one or more instructions for controlling the one or more processes of the quantum operation component 103 and/or for controlling the quantum logic circuit 108 and/or waveform generator 110.

The quantum operation component 103 can obtain (e.g., download, receive, search for and/or the like) a quantum job request 104 requesting execution of one or more quantum programs. The quantum operation component 103 can determine one or more quantum logic circuits, such as the quantum logic circuit 108, for executing the quantum program. The request 104 can be provided in any suitable format, such as a text format, binary format and/or another suitable format. In one or more embodiments, the request 104 can be received by a component other than a component of the quantum system 101, such as a by a component of a classical system coupled to and/or in communication with the quantum system 101.

The waveform generator 110 can perform one or more quantum processes, calculations and/or measurements for operating one or more quantum circuits on the one or more qubits 107A, 107B and/or 107C. For example, the waveform generator 110 can operate one or more qubit effectors, such as qubit oscillators, harmonic oscillators, pulse generators and/or the like to cause one or more pulses to stimulate and/or manipulate the state(s) of the one or more qubits 107A, 107B and/or 107C comprised by the quantum system 101. That is, the waveform generator 110, such as in combination with the quantum controller 106, can execute operation of a quantum logic circuit on one or more qubits of the circuit (e.g., qubit 107A, 107B and/or 107C). In response, the quantum operation component 103 can output one or more quantum job results, such as one or more quantum measurements 120, in response to the quantum job request 104.

The quantum logic circuit 108 and a portion or all of the waveform generator 110 can be contained in a cryogenic environment, which may be provided with a cryogenic chamber 116, such as a dilution refrigerator. Indeed, a signal can be generated by the waveform generator 110 within the cryogenic chamber 116 to manipulate and/or to control the one or more qubits 107A-C. Where qubits 107A, 107B and 107C are superconducting qubits, cryogenic temperatures, such as about 4K or lower can be employed to facilitate function of these physical qubits. Accordingly, the elements of the waveform generator 110 also are to be constructed to perform at such cryogenic temperatures.

The following/aforementioned description(s) refer(s) to the operation of a single quantum program from a single quantum job request. However, one or more of the processes described herein can be scalable, such as execution of one or more quantum programs and/or quantum job requests in parallel with one another.

In one or more embodiments, the non-limiting system 100 can be a hybrid system and thus can include both one or more classical systems, such as a quantum program implementation system, and one or more quantum systems, such as the quantum system 101. In one or more other embodiments, the quantum system 101 can be separate from, but function in combination with, a classical system.

In such case, one or more communications between one or more components of the non-limiting system 100 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

Figure 2:
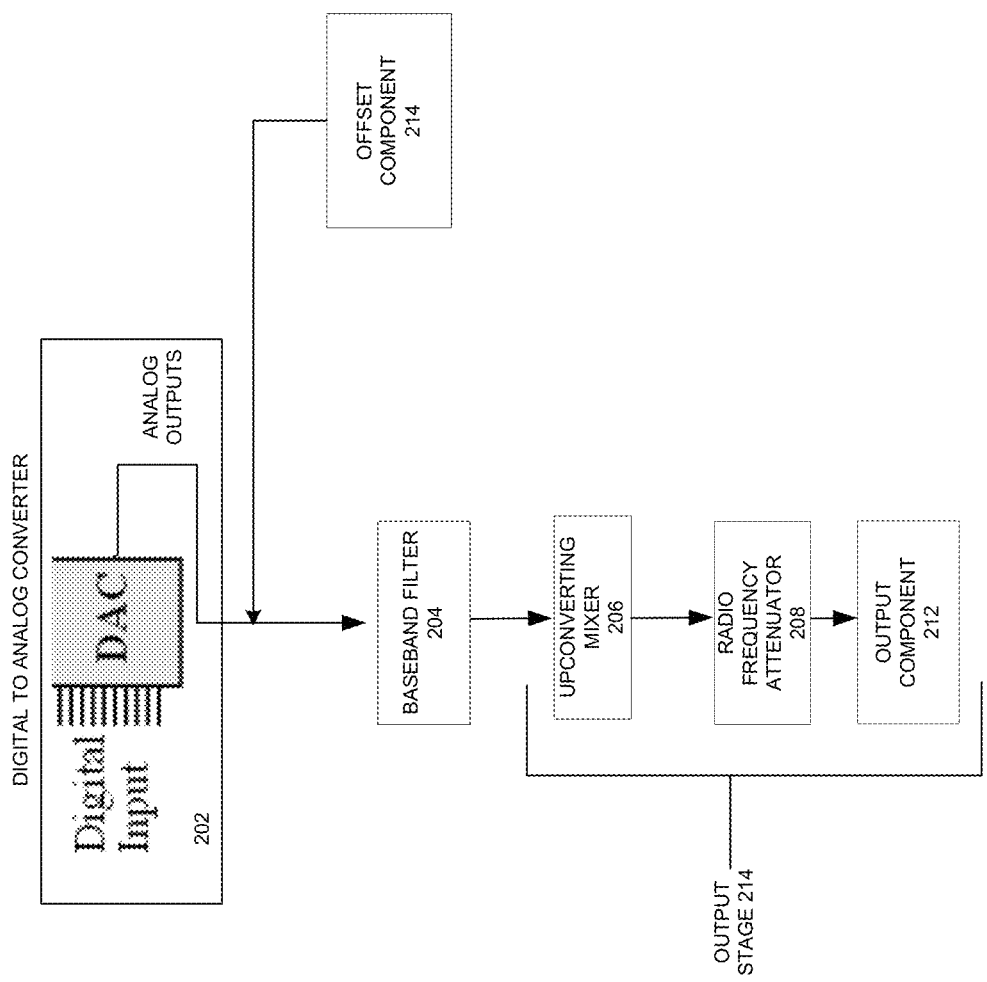
FIG. 2 illustrates a block diagram of an example system implementation that implements an integrated radio frequency (RF) pulse generator utilizing a current-mode signal path.

FIG. 2 illustrates a block diagram of an example non-limiting system 200 (also herein referred to as a device) that can be comprised by the waveform generator 110 of the quantum system 101 of the non-limiting system 100 of FIG. 1. The non-limiting system 200 can access data and process that data using variable computing components depicted in accordance with one or more embodiments described herein. The non-limiting system 200 can facilitate a process of assessing and identifying large amounts of various forms of data, using machine learning, and training a neural network or other type of model. The non-limiting system 200 can also generate predictive recommendations to an individual level with context in accordance with one or more embodiments described herein. Portions of systems (e.g., non-limiting system 200 and the like), apparatuses or processes of one or more embodiments described herein can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform operations described herein. Repetitive description of like elements employed in one or more embodiments described herein is omitted for sake of brevity.

Generally, the subject computer processing system(s), methods, apparatuses and/or computer program products can be employed to solve new problems that can arise through advancements in technology, computer networks, the Internet and the like.

In today's digital world, one of the largest growth areas in electronics has been in applications of wireless communications. Modern radio frequency systems such as 3G/4G/5G base stations are based on wideband multi-channel architectures. To facilitate flexibility in signal generation, modulation, and processing, modern RF transmitters typically employ one or more high-speed digital to analog converters (DACs). Such high-speed DACs provide arbitrary waveform generation capability for RF signals, which can be useful in both quantum-related and non-quantum related applications, as indicated above.

One such quantum-related application can be the control of qubits in the field of quantum computing, where there is a desire for generating RF control pulses with variable amplitudes and low distortion (high spectral purity). Minimizing power consumption for such RF pulse generators is valuable, especially in the context of cryogenic signal generation for qubit control. A challenge with designs that utilize voltage mode representations for the signal path includes high dynamic range requirements at block interfaces, leading to nonlinear behavior and the generation of higher amplitude distortion products. Thus, these embodiments propose a promising solution to this problem by introducing a current-mode signal path design in the implementation of an integrated RF pulse generator system, and for example, a system and/or device that can provide current reuse, and thus power efficiency and/or related distortion reduction as compared to existing techniques.

The non-limiting system 200 can facilitate an integrated radio frequency (RF) pulse generator utilizing a current-mode signal path. Embodiments described herein relate to maintaining elements of a signal path, a digital to analog converter (DAC) 202, baseband filter 204, upconverting mixer 206, radio frequency (RF) attenuator 208, an output component 212 (e.g., a current-mode amplifier), and an offset component 214. The radio frequency (RF) attenuator 208 and an output component 212 together can be regarded as at least a portion of an output stage 214 of the non-limiting system 200. In one or more embodiments, the upconverting mixer 206 can be considered as at least a portion of the output stage 214. Benefits can be achieved by implementing an entire chain in current-mode. Although FIG. 2 depicts utilization of the upconverting mixer 206, the RF attenuator 208, together, other embodiments can omit one or more of these components as well as cascade respective components in any suitable manner.

Non-limiting system 200 can optionally include a server device, one or more networks and one or more devices (not shown) and/or such elements can be comprised more generally by the quantum system 101, where the non-limiting system 200 is comprised by such quantum system 101.

The non-limiting system 200 can also include or otherwise be associated with the digital to analog converter 202 operating in current-mode wherein analog inputs and analog outputs of system blocks are represented as currents. The digital signal input to the DAC 202 can be, for example, baseband digital in-phase and quadrature data (I and Q data) representing any suitable signals such as, for example, signals for a wireless transmitter, signals for implementing control pulses for qubits, etc., but are not limited to such. The analog output of DAC 202 in the form of a current can be directed to a baseband filter 204. The baseband current output of the baseband filter 204 can be frequency translated up to RF frequencies by an upconverting mixer 206, which can be driven by a local oscillator (LO) signal. Optionally the LO signal waveform can use complementary metal-oxide-semiconductor (CMOS) rail-to-rail levels, such as those generated by a CMOS inverter.

The radio frequency (RF) attenuator 208 can operate with the DAC 202, baseband filter 204, and the upconverting mixer 206. Output component 212 receives an output current of the RF attenuator 208. In some embodiments, the output component 212 can include an impedance conversion component (e.g., a transformer or current-mode amplifier). The corresponding signal chain can produce an output current signal with the DAC 202, baseband filter 204, the upconverting mixer 206, and the RF attenuator 208. Direct current (DC) offsets in the baseband signals (for instance, DC offsets in the output currents of the baseband filter 204) can be converted by the upconverting mixer to unwanted LO tones (LO "leakage") in the output of the RF pulse generator system 200. To suppress such LO leakage, DC offset cancellation can be applied by an offset component 214, which adds a compensating DC offset to the baseband signal. The DAC 202, the baseband filter 204, the upconverting mixer 206, the RF attenuator 208, the output component 212 and/or the offset component 214 can be cryo-electronic component(s) (e.g., electronic component(s) that can operate at cryogenic temperatures).

In an implementation, a current-mode end-to-end path from the digital to analog converter (DAC) 202 through output component 212 can facilitate realization of a favorable set of trade-offs regarding power consumption and distortion. In this signal path, the DAC 202 operating in current-mode can implement an integrated DAC solution wherein the baseband filter 204 incorporated with upconverting mixer 206 and RF attenuator 208 can operate in current-mode wherein analog input and analog output signals between system blocks can be represented as currents. The upconverting mixer 206 can be driven by an LO signal, which optionally may use complementary metal-oxide-semiconductor (CMOS) rail-to-rail levels. The radio frequency (RF) attenuator 208 can operate with the DAC 202, baseband filter 204 and the upconverting mixer 206. Thus, the current-mode signal path of an integrated RF pulse generator solution may facilitate reduced power consumption through leverage of current reuse, enhance linearity by minimizing voltage-to-current and current-to-voltage conversions, and enable cascaded solutions using current-mode approaches.

Figure 3:
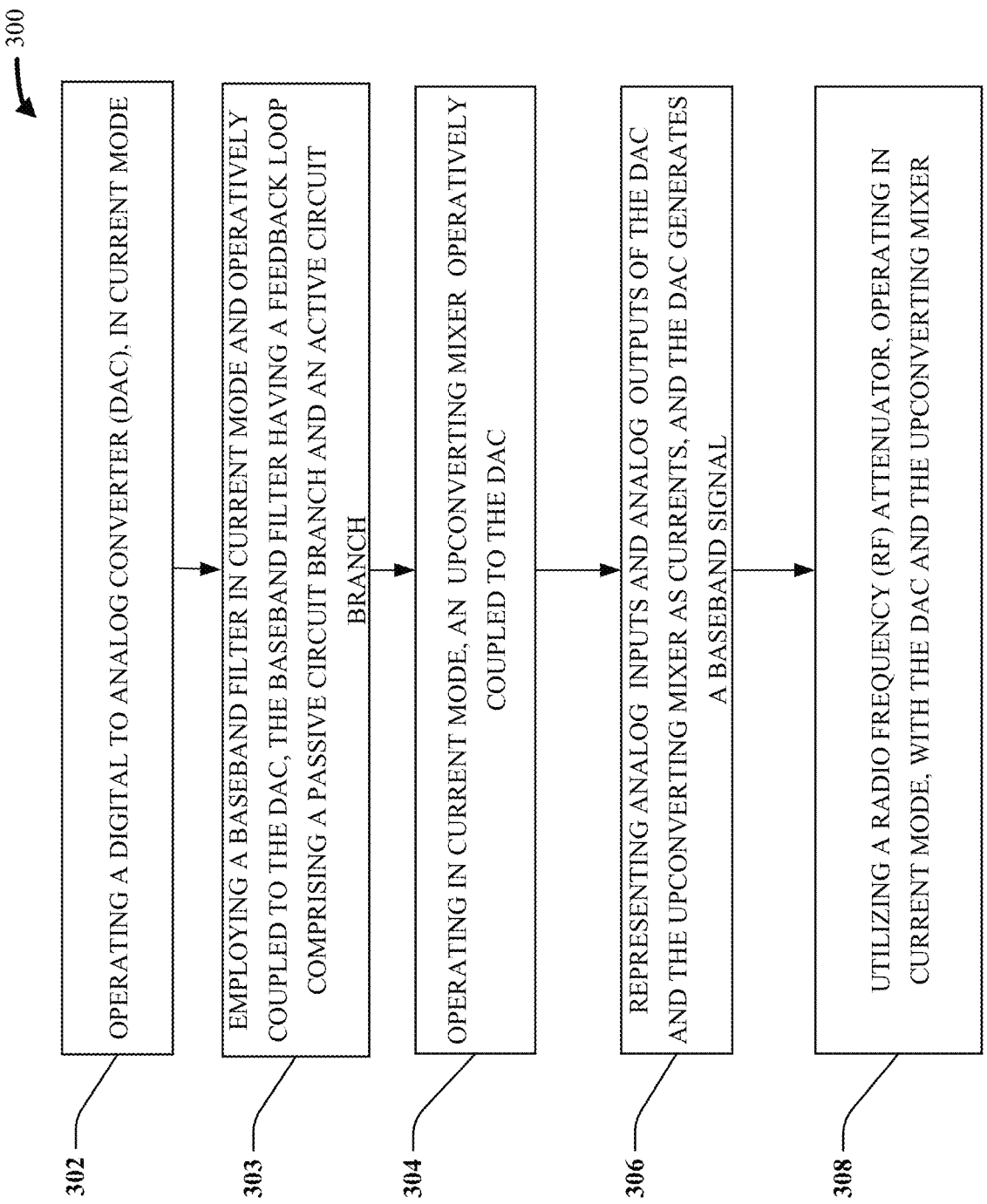
FIG. 3 illustrates an example framework of a methodology to integrate a radio frequency (RF) pulse generator utilizing a current-mode end-to-end signal path.

FIG. 3 illustrates an example framework 300 of a methodology to integrate a radio frequency (RF) pulse generator utilizing a current-mode end-to-end signal path. Facets of the framework are operating a digital to analog converter (DAC) in current-mode at 302, at 303 employing a baseband filter in current mode and operatively coupled to the DAC, the baseband filter having a feedback loop comprising a passive circuit branch and an active circuit branch, and at 304 operating in current-mode an upconverting mixer operatively coupled to the DAC. At 306, representing analog inputs and analog outputs of the DAC and the upconverting mixer as currents, and the DAC generates a baseband signal. At 308, the methodology utilizes a radio frequency (RF) attenuator, operating in current-mode, with the DAC and the upconverting mixer. Subsets of steps 304, 306 or 308 can be optional. Thus, the framework can provide for an entire chain that operates in current-mode (or optionally implements sub-elements of the chain in current-mode) by integrating a DAC interface to an upconverting mixer, and RF attenuator to generate an output. Functionality can be implemented in current-mode and any two blocks can also be interfaced in current-mode. A stage can utilize current-mode signals and the signals can be attenuated and multiplied. Starting from the baseband filter, the current-mode signals can be scaled up/down in the circuit stages, at the interfaces between stages, and optionally in an impedance matching network wherein the impedance matching network is part of an output component stage. These methods can reduce end-to-end power consumption through leverage of current reuse and enhance end-to-end linearity (reduce distortion) by minimizing voltage-to-current and current-to-voltage conversions. Low output signal requirements can aid to implement the signal chain efficiently, and the methods can enable cascaded solutions using current-mode approaches.

Figure 4:
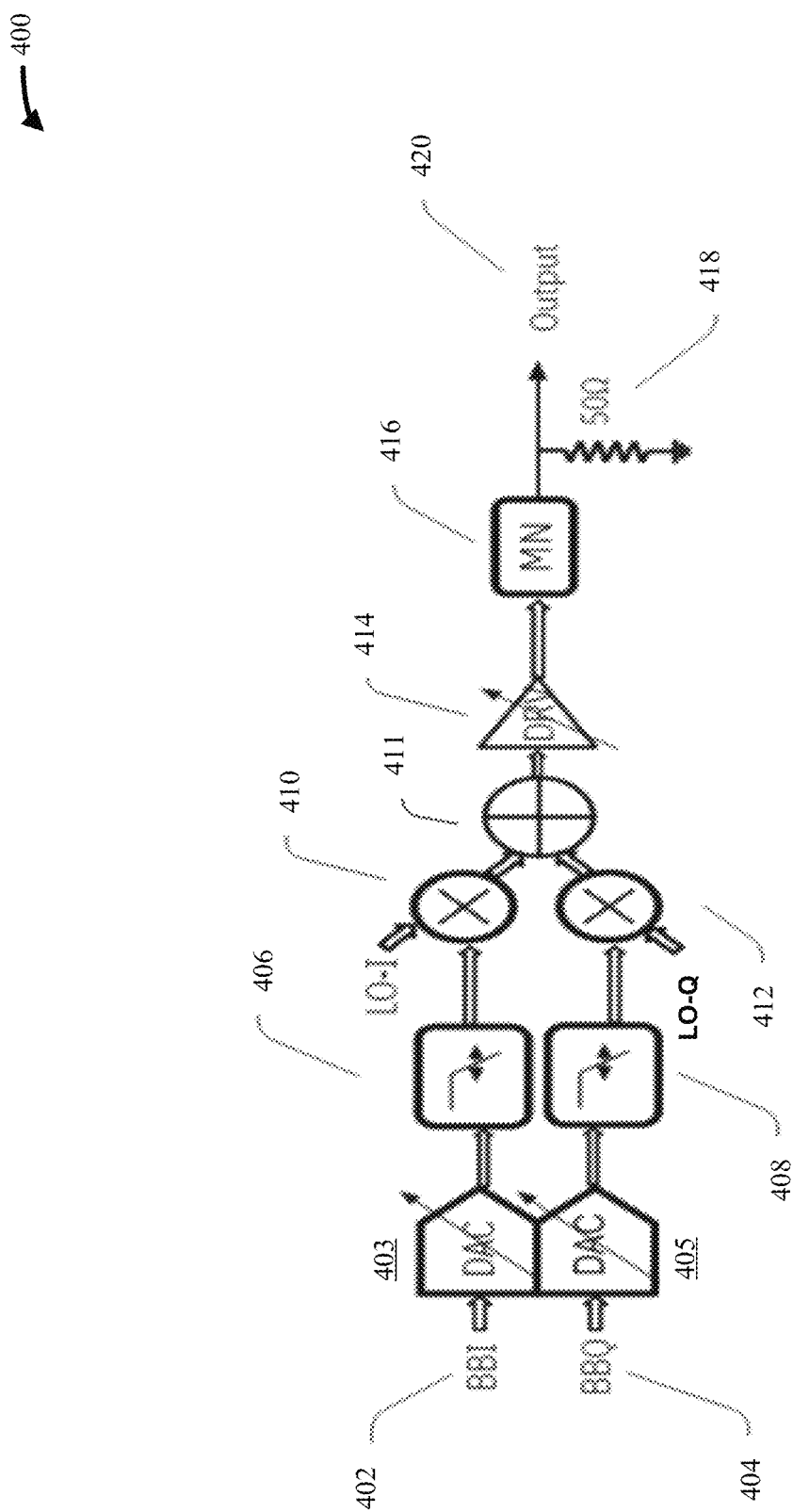
FIG. 4 illustrates an example architecture of a radio frequency (RF) pulse generator signal chain.

FIG. 4 illustrates an example architecture of an RF pulse generator signal chain including two or more DACs (403, 405) in quadrature, two or more base-band filters 406, 408 in quadrature, two or more upconverting mixers (410, 412) in quadrature and a summer 411 that generates a summed output of respective output signals of the upconverting mixers. In this embodiment, and unlike conventional systems, respective subblocks can be implemented in current-mode and all analog signals transferred between subblocks are represented as currents. Inputs (e.g., digital words) to the DACs (403, 405) are digital.

One method to generate complex signals can be to modulate a carrier signal frequency by a local oscillator using a vector modulator. In RF applications, baseband digital I and Q signals are generated using arbitrary waveform generators (AWGs) which contain two or more synchronized digital to analog converters (DACs). An RF pulse generator signal chain architecture 400 can receive baseband digital in-phase signal (BBI signal) 402 and baseband digital quadrature signal (BBQ signal) 404. Multi-bit baseband digital to analog converters (DACs) 403 and 405 can employ digital bits and depending on the bandwidth of a signal and a sampling clock frequency, convert digital bits to an analog signal. This can enable the output of a current and provides a filtered and amplified current to the upconverting mixers 410 and 412.

Signals can be processed through low pass filters 406 and 408 to reject out-of-band noise components resulting from the DACs (403, 405). The filtered signals can be mixed and thus upconverted, by upconverting mixers 410 and 412, using two carriers (LO-Q and LO-I) having orthogonal phases 0 and 90 degrees for I and Q. Using a signal combiner 411, the resulting signals can be combined by creating a single side band signal representation. For example, if (x*y) function needs to be performed in a single side band representation, then variable x can be represented as a combination of 0 and 90 degrees and variable y can be represented as a combination of 0 and 90 degrees. These two variables can then be multiplied and added, similar to the scalar product of two vectors. An output of this function can be processed through a driver (DRV) 414.

A matching network (MN) 416 is a component typically consisting of passive elements that do not add distortions. The matching network 416 can transform resistance 418 (e.g., 50 ohms) to an impedance the driver requires, in order to maximize power transfer.

In the RF pulse generator system 400, the outputs of the DACs (403, 405) can be filtered and up-converted using I- and Q-channel mixers, and resulting signals are combined and fed through a driver and matching network to a nominal load (e.g., 50 ohm) at output 420.

The filter implementation and the interface between the filter and the other elements of the signal chain can be useful in such designs. Continuous-time filters can be well suited for high dynamic range, low power active filter implementations. Traditional current-mode input filter using an operational amplifier can consume a significant amount of power and can have limitations in high frequency applications. Continuous time transconductance ($G_m$)-capacitance (C) filters ($G_m$-C filters) typically can provide a high input impedance, which can lead to higher distortion products. A $G_m$-C type filter is well suited for high frequency applications but can be limited in terms of the dynamic range it supports as its input is typically a voltage.

Current-mode signal processing can be well suited for low distortion applications, as it reduces voltage swings at various nodes of interest. Another benefit of current-mode circuits can be current reuse, in which bias and signal currents of one stage are shared with another stage (e.g., typically by stacking circuit stages). Since reuse can decrease total current drawn from a power supply, circuit power efficiency can be improved. However, conventional current-mode input filters, e.g., using an operational amplifier can consume significant amount of power and can have limitations to high frequency applications. An efficient current-mode filter stage can facilitate realizing an end-to-end current-mode signal path for low-power consumption through leverage of current reuse and can enhance end-to-end linearity by minimizing voltage-to-current and current-to-voltage conversions. Low output signal requirements can be an advantage to implementing a signal chain efficiently.

Figure 5:
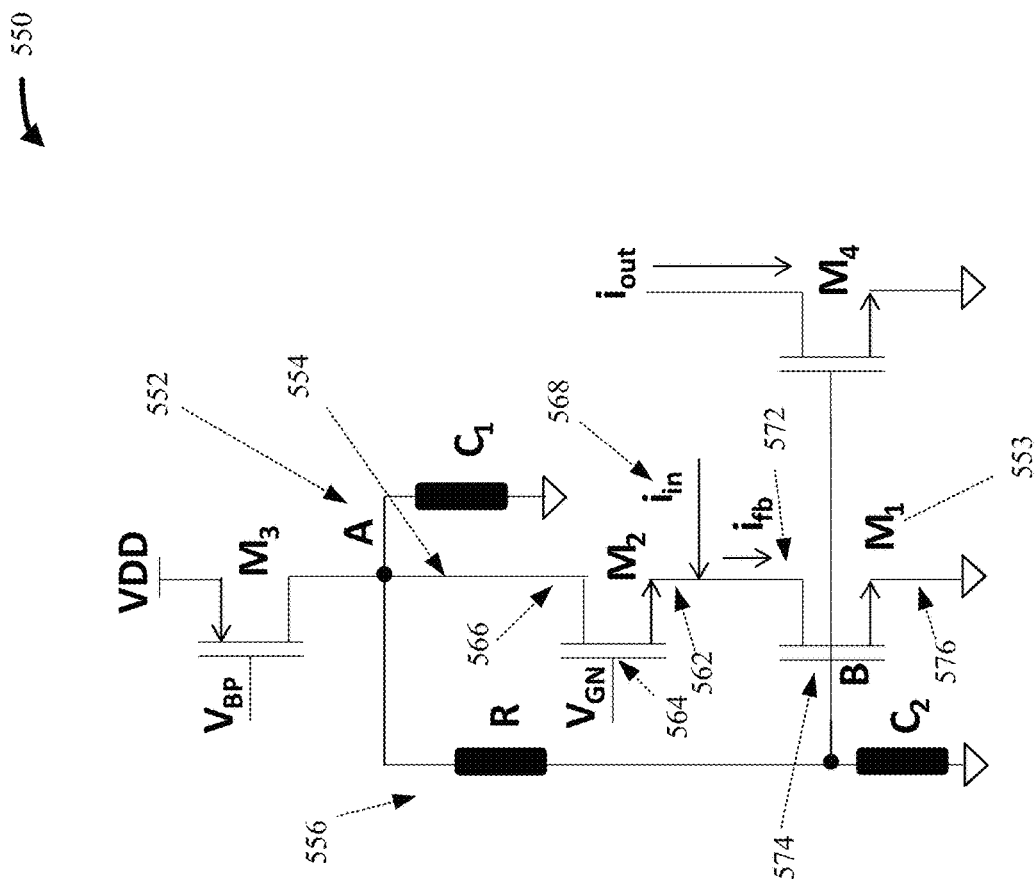
FIG. 5 illustrates example schematics of a pair of different baseband filters, each in accordance with one or more embodiments described herein.
Figure 5:
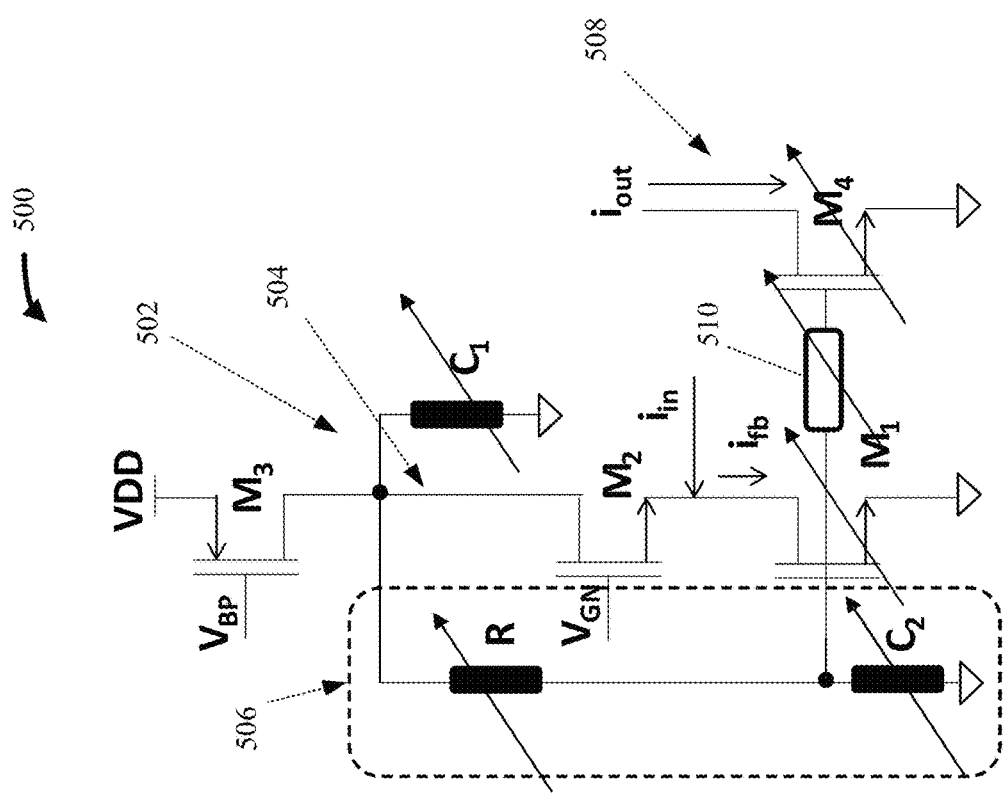

FIG. 5 illustrates an example schematic of a device 500, which is a baseband filter 500, in accordance with one or more embodiments herein. The baseband filter 500 can be employed as the baseband filter 204 or at the output of the DAC 403. Generally, as will be described below, the device 500 can be a fully current-mode and continuous time baseband filter for which gain can be varied with respect to a fine baseline step. The baseband filter 500 meets desired requirements of cryogenic waveform generation, such as relative to a quantum system. However, again, the one or more embodiments described herein also can be practiced outside of the quantum environment, such as relative to wireless transceivers used in internet of things, sensors and/or memory arrays.

The baseband filter 500 can receive an input current and output an output current. The baseband filter (BBF) 500 can comprise a feedback loop 502 having an active circuit branch 504 and a passive circuit branch 506. The passive circuit branch 506 can be non-static power consuming. As depicted, the active and passive circuit branches are coupled in a loop. The passive circuit branch 506 can comprise passive components, such as resistors, capacitors and inductors. The active circuit branch 504 can comprise both passive and active circuit components. As depicted, the active circuit branch 504 can comprise a pair of transistors $M_1$ and $M_2$, as well as a capacitor $C_1$. The active circuit branch 504 and the passive circuit branch 506 together can provide a pair of poles that are separable in frequency. This is because the loop can comprise two reactive elements (e.g., $C_1$ and $C_2$) that can be independently controlled, and the loop transfer function can comprise two roots in the frequency domain.

An output stage 508 can be coupled to the feedback loop 502. As depicted, the transistor of output stage 508 can form a current mirror with transistor $M_1$ of the active circuit branch 504. The output stage 508 of the BBF 500 also can comprise an additional circuit portion 510, which can form an RC filter with the gate capacitance of the output stage 508 transistor. This RC filter can provide an additional pole at no cost in static bias current, so that a power-efficient $3^{rd}$-order lowpass filter is realized.

Looking next to the baseband filter 550 at FIG. 5, the additional circuit portion 510 can be omitted. Node A can be a high impedance node. If desired, in one or more embodiments, a voltage mode bandpass output can be taken from point A and used. Further, if desired, in one or more embodiments, a lowpass current mode output can be taken from point B.

As illustrated, a baseband filter 550 can operate in current mode and can receive an input current and output an output current. The baseband filter 550 can comprise a first transistor $M_2$ having a source 562, gate 564 and drain 566. The source 562 can be coupled, such as directly connected, to an input terminal 568. The gate 564 can be coupled, such as directly connected, to a bias voltage (common gate stage bias $V_{GN}$). The drain 566 can be coupled, such as directly connected, to a capacitor, e.g., capacitor $C_1$. The capacitor $C_1$ can have a capacitance value so that capacitor $C_1$ of the active circuit branch 554 can provide a first pole at a first desired frequency.

The passive circuit branch 556 can couple the drain 566 of the first transistor $M_2$ to the gate 574 of a second transistor $M_1$. The passive circuit branch 556 can comprise a capacitor, e.g., capacitor $C_2$. The capacitor $C_2$ can have a capacitance value so that capacitor $C_2$ of the passive circuit branch 556 can provide a second pole at a second desired frequency. The second transistor $M_1$ can have a source 576 and drain 572, along with the gate 574. The source 576 is illustrated as coupled, such as directly connected, to ground, but alternatively can be coupled, such as directly connected, to a power supply. The drain 572 can be coupled, such as directly connected, to the input terminal 568, and thus also can be coupled, such as directly connected, to the source 562 of the first transistor $M_2$.

The baseband filter 550 further can comprise a third transistor $M_3$ that can operate as a bias current source and can be coupled to the drain 566 of the first transistor $M_2$. The third transistor $M_3$ also can be coupled to the gate 574 of the second transistor $M_1$ by the passive circuit branch 556. The passive branch 556 can be formed from a resistor R and the capacitor $C_2$.

A mirroring stage $M_4$ can be coupled, such as directly connected, to the gate 574 of the second transistor $M_1$. The mirroring stage $M_4$ can provide an output of the baseband filter 550.

The aforementioned discussion regarding sources, gates and drains of the transistors of baseband filter 550 likewise also can apply to the baseband filter 500. As illustrated, the baseband filter 500 differently comprises the additional circuit portion 510, which is coupled, such as directly connected, to the gate of the transistor $M_1$ at BBF 500, and thus couples the transistor $M_1$ to the mirroring stage $M_4$ of the BBF 500. The additional circuit portion 510 can provide a third pole of the BBF 500 at a third desired frequency.

Looking still to the BBF 550, the BBF can have unity gain, with gain adjustable at the output. The BBF 550 is a high quadratic filter having two poles provided by the passive circuit branch 556 and active circuit branch 554 of the current feedback loop 552. The BBF 550 can have a quadratic transfer function in the frequency domain.

With respect to provision of the poles of the current feedback loop 552:

$$i_{fb} = \frac{(i_{in} - i_{fb})\left(\frac{1}{sC_1}\right)}{R + \frac{1}{sC_1} + \frac{1}{sC_2}}\left(\frac{g_{m1}}{sC_2}\right) \rightarrow \frac{i_{fb}}{i_{in}} = \frac{\frac{g_{m1}}{RC_1C_2}}{s^2 + s\left(\frac{C_1+C_2}{RC_1C_2}\right) + \left(\frac{g_{m1}}{RC_1C_2}\right)}. \quad \text{Equation 1}$$

Here, variable representations are provided: $i_{fb}$ is the feedback current in the loop (it is the drain current of transistor M1), $g_{m1}$ is the transconductance of transistor M1, C1 and C2 are capacitances coupled to the nodes in the loop, and R is the resistor that is used in the passive circuit branch 556.

The active or dominant pole can be represented by:

$$\omega_1 = \frac{g_{m1}}{(C_1 + C_2)}. \quad \text{Equation 2}$$

Here, $\omega_1$ (e.g., $g_{m1}$) can be dependent upon biasing of the $M_1$ transistor 553. Subsequently, dependent on the size of the $M_1$ transistor 553 and current at the $M_1$ transistor 553, the quiescent current consumption of the $M_1$ transistor 553 can be chosen to provide the desired value of $\omega_1$.

The passive or non-dominant pole can be represented by:

$$\omega_2 = \frac{C_1 + C_2}{RC_1C_2}. \quad \text{Equation 3}$$

Further, natural frequency $\omega_n$ can be represented by $$\omega_n = \sqrt{\frac{g_{m1}}{RC_1C_2}}. \quad \text{Equation 4}$$

Quality factor, Q, can be represented by $$Q = 2\sqrt{g_{m1}R}\left[\frac{\sqrt{C_1C_2}}{(C_1+C_2)}\right]. \quad \text{Equation 5}$$

That is, in view of tradeoff considerations with bias current, distortion and linearity, when used in a current-mode system or architecture, distortion of the BBF 550 can become dominant. The pair of poles can track one another with respect to capacitor trimming. Further, for better process tracking, $g_m$ can be made to track R, where $g_mR=K$ biasing (Equation 6). That is, $g_{m1}$ can be made proportional to 1/R, and thus as process and temperature shift relative to the BBF 550, the two poles provided by the current feedback loop 552 can move by equal amounts and can maintain a same phase margin over temperature.

Figure 6:
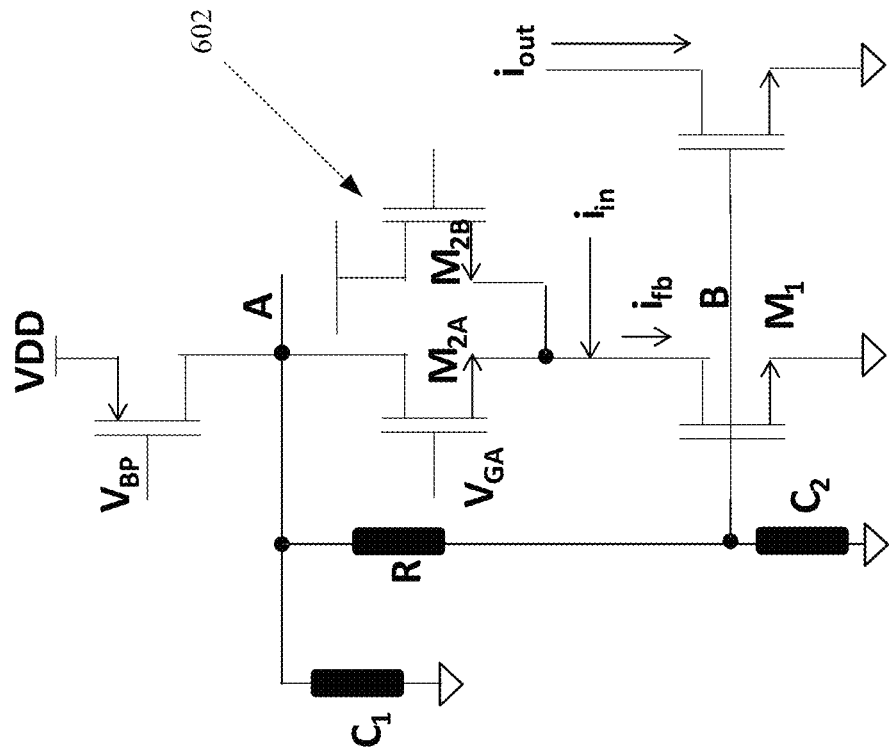
FIG. 6 illustrates an example schematic of a baseband filter, in accordance with one or more embodiments described herein.

Turning now to FIG. 6, a BBF 600 is shown further comprising a current shunting element 602 that absorbs some of the current that otherwise would flow through transistor $M_{2A}$. The current shunting element 602 can be optional. Accordingly, in such embodiment, node A can provide a band-pass response and node B can provide a low-pass response. In one or more embodiments, a drain current of the current shunting element 602 can provide a high-pass response. Accordingly, the BBF 600 can provide low pass or high pass functions. In one or more embodiments, the drain current of the current shunting element 602 can be sensed using a diode-connected transistor (not shown).

Figure 7:
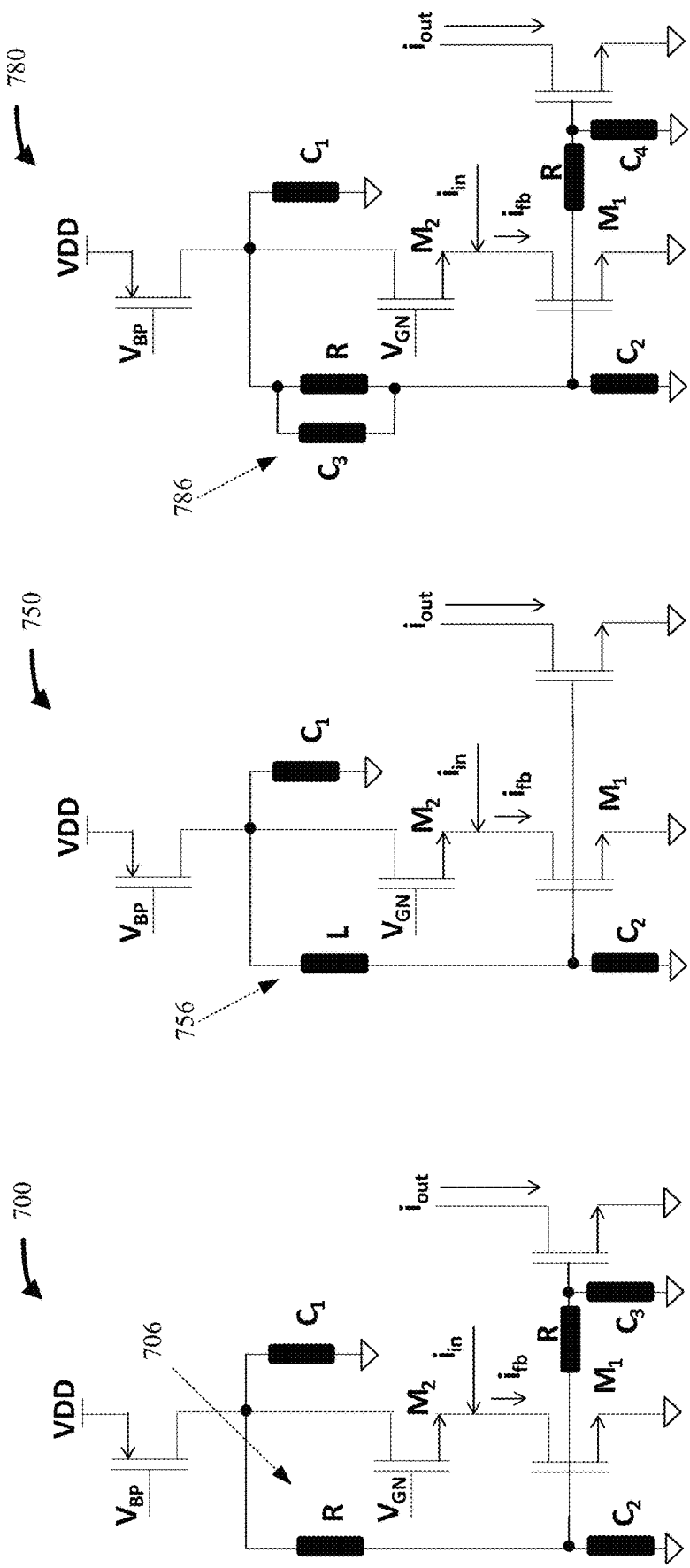
FIG. 7 illustrates example schematics of three different baseband filters each having different passive circuit branch elements, in accordance with one or more embodiments described herein.

Looking now at FIG. 7, three different BBF embodiments, generally in accordance with the BBF 500 and the BBF 550, are depicted. BBF 700, BBF 750 and BBF 780 each employ different circuit elements at the respective passive circuit branches 706, 756 and 786. Each of the BBFs 700, 750 and 780 can provide high order filter characteristics. The passive circuit branch of a respective BBF, while still being non-static power consuming, can be realized in various ways with one or more various passive circuit elements. In one or more embodiments, such as relative to each of the BBFs 700, 750 and 780, the passive circuit branches 706, 756 and 786 do not block DC current and as such, can enable biasing at the gates of the respective transistors $M_1$. As shown at the BBF 700, the passive circuit branch 706 can comprise a resistor R and a capacitor $C_2$ coupled in series. As shown at the BBF 750, the passive circuit branch 756 can comprise an inductor L and a capacitor $C_2$ coupled in series. As shown at the BBF 780, the passive circuit branch 786 can comprise a resistor R and capacitor $C_3$ coupled in parallel, which together can be coupled in series with a capacitor $C_2$. Changing the passive circuit branch can alter the transfer function of the BBF, so the choice among BBF embodiments 700, 750, or 780 may be made to meet system-level filtering requirements.

Figure 8:
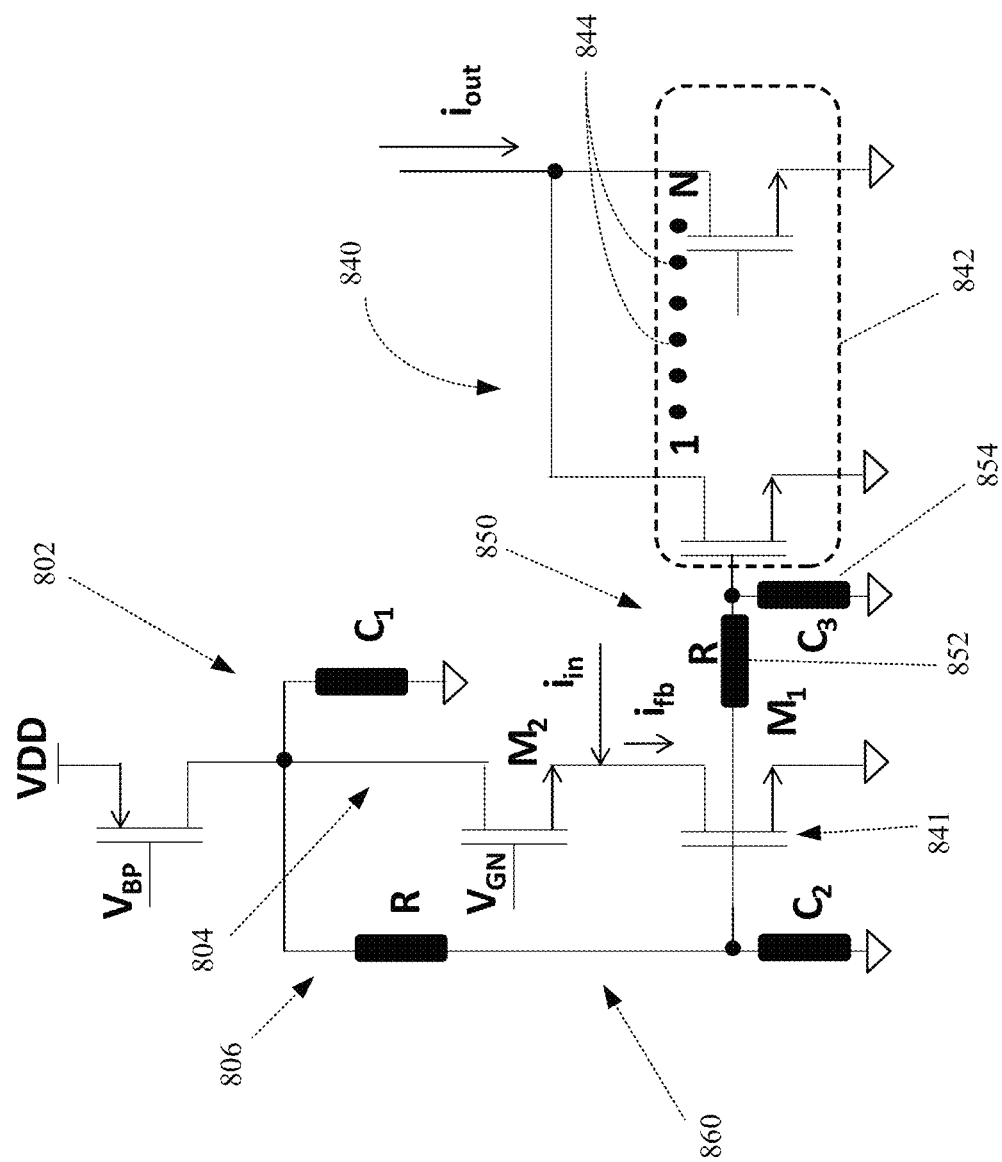
FIG. 8 illustrates an example schematic of a baseband filter, in accordance with one or more embodiments described herein.

Turning next to FIG. 8, a variable gain can be implemented at the output of a respective BBF. This can allow for the desired filter characteristics with variable gain. As depicted at FIG. 8, a mirroring stage 840 of a BBF 800 can be coupled to the feedback loop 802. The mirroring stage 840 can comprise a mirroring device 842 that can comprise one or more sub-unit mirroring devices 844, as depicted. The mirroring device 842 provides an output of the BBF 800.

The mirroring device 842 can be selectively activated, such as by a digital controller (not shown) to vary gain at the output of the BBF 800. Indeed, in one or more embodiments, different sub-unit mirroring devices 844 of the parent mirroring device 842 can be differently activated to provide a wider range of variable gain. That is, the different sub-unit mirroring devices 844 of the parent mirroring device 842 can be selectively and separately activated, such as by one or more digital controllers (not shown), to change a current ratio of the mirroring device 842, thus changing gain.

The sub-unit mirroring devices 844 can be realized by transistors, and thus the mirroring device 842 can be realized as a set of one or more transistors. The transistors can be ratioed with respect to transistor $M_1$ (841) such as to scale a current carried by transistor $M_1$ (841).

Also at FIG. 8, while the active circuit branch 804 and the passive circuit branch 806 can provide a pair of poles separable in frequency, an additional circuit portion 850 can be coupled between the filter core stage 860 (having the feedback loop 802) and the mirroring stage 840 to provide an additional pole. The additional pole can have one or more advantages, such as where three poles can be realized while incurring distortion of only one transconductor stage.

The additional pole can be realized by the additional circuit portion 850 having one or more circuit elements, such as non-static power consuming circuit elements. As depicted, the additional circuit portion 850 comprises a resistor 852 and a capacitor $C_3$ 854, and thus the additional circuit portion is non-static power consuming. Alternative circuit elements can be employed in other embodiments.

Figure 9:
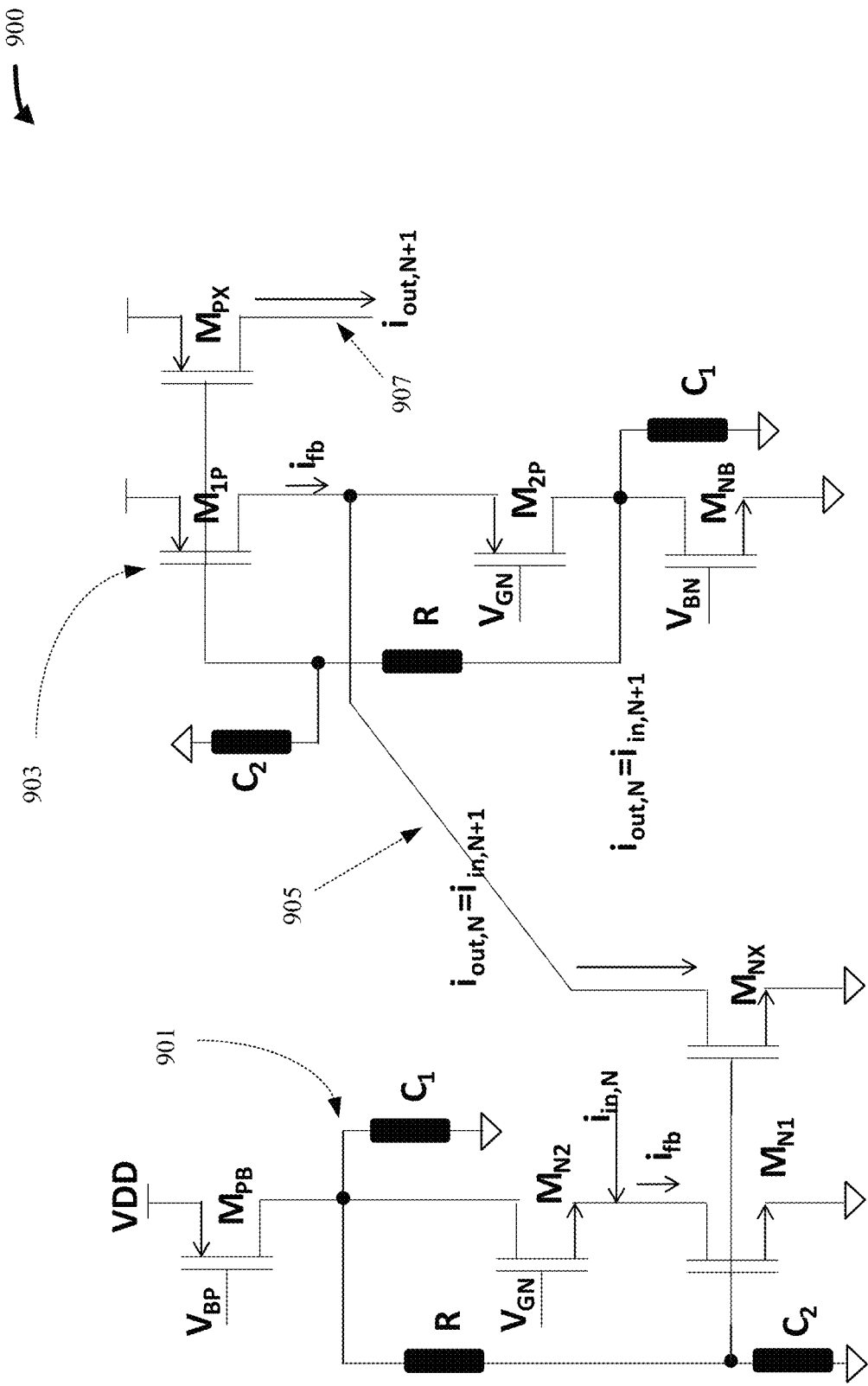
FIG. 9 illustrates an example schematic of cascaded baseband filters, each in accordance with one or more embodiments described herein.

Looking to FIG. 9, one or more BBFs can be coupled (e.g., cascaded) in a cascade system 900. Depicted is a first, $2^{nd}$ order BBF 901 coupled to a second, $2^{nd}$ order BBF 903. Using NMOS transistors in BBF 901 and PMOS transistors in BBF 903 (except for the bias transistors $M_{PB}$ and $M_{NB}$, which are PMOS-type for BBF 901 and NMOS-type for BBF 903) can allow these two BBFs 901 and 903 to be coupled by a wire 905. In particular, a drain of NMOS transistor $M_{NX}$ (generating the output current of BBF 901) can be directly coupled to the source of PMOS transistor $M_{2P}$, which source can be the input terminal of BBF 903. A combination of the BBF 901 and BBF 903 (e.g., the cascaded system 900) is representative of a $4^{th}$ order system. In an embodiment, an additional $2^{nd}$ order BBF, such as a copy of the $2^{nd}$ order BBF 901, can be further coupled to an output 907 of the $2^{nd}$ order BBF 903.

Figure 10:
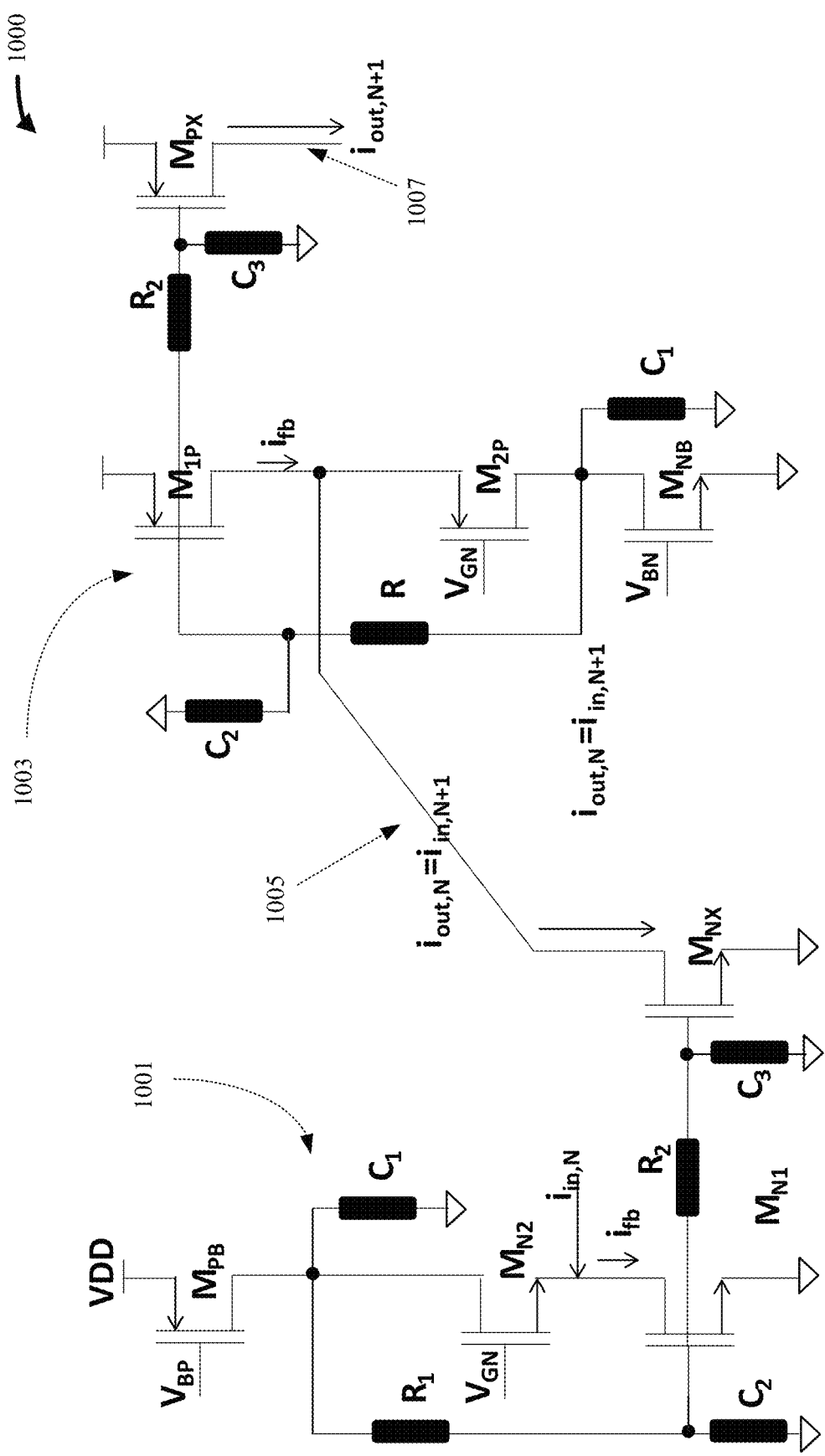
FIG. 10 illustrates another example schematic of cascaded baseband filters, each in accordance with one or more embodiments described herein.

At FIG. 10, similarly, a first, $3^{rd}$ order BBF 1001 can be coupled (e.g., cascaded) to a second, $3^{rd}$ order BBF 1003. Again, opposite transistor types (PMOS versus NMOS) can be used in the two BBFs 1001 and 1003 such that the BBFs 1001 and 1003 can be directly coupled by a wire 1005. A combination of the BBF 1001 and BBF 1003 (e.g., the cascaded system 1000) can be representative of a $6^{th}$ order system. In an embodiment, an additional $3^{rd}$ order BBF, such as a copy of the $3^{rd}$ order BBF 1001, can be further coupled to an output 1007 of the $3^{rd}$ order BBF 1003.

Figure 11:
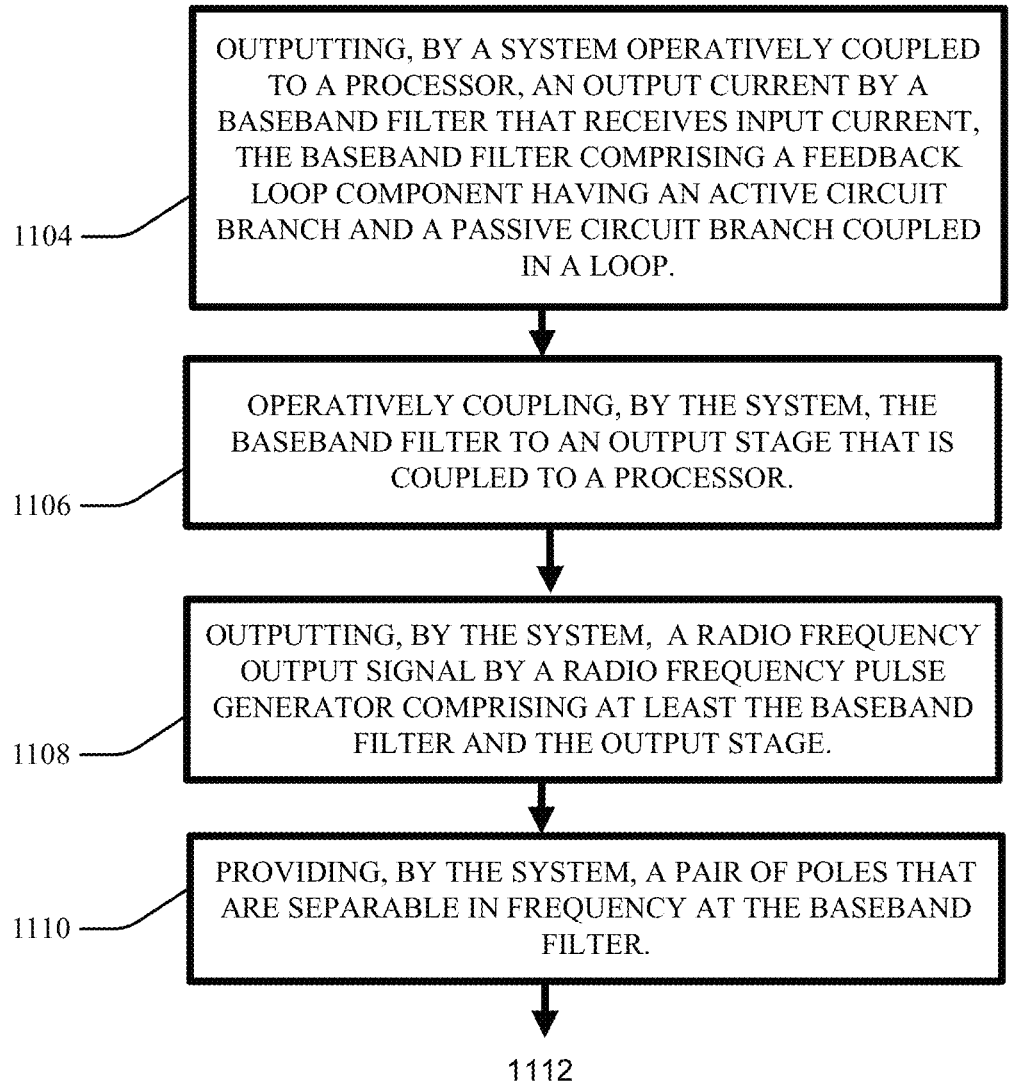
FIG. 11 illustrates a flow diagram of an example, non-limiting method that can facilitate use of a device, in accordance with one or more embodiments described herein.
Figure 12:
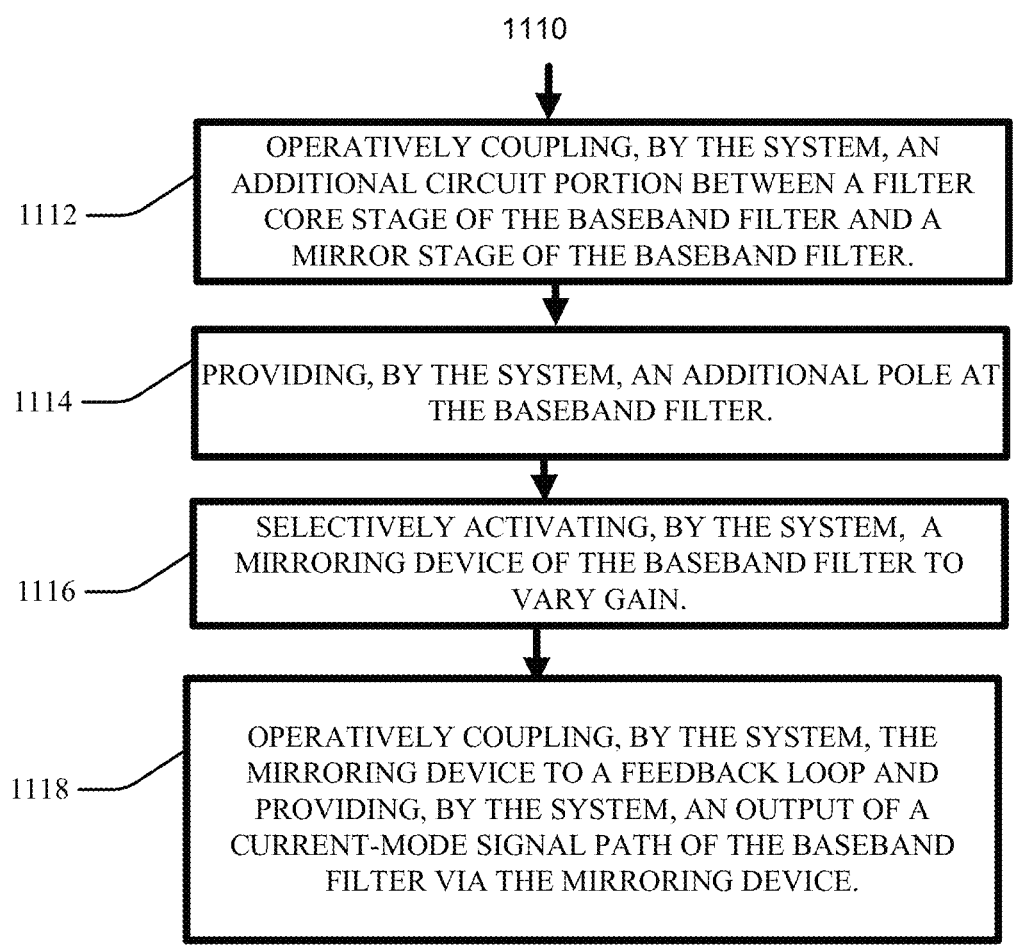
FIG. 12 illustrates a continuation of the flow diagram of FIG. 11 of an example, non-limiting method that can facilitate use of a device, in accordance with one or more embodiments described herein.

Next, FIGS. 11 and 12 illustrate a flow diagram of an example, non-limiting method 1100 that can facilitate a process to use a BBF device in accordance with one or more embodiments described herein, such as the devices 500, 550, 600, 700, 750, 780, 800, 901, 903, 1001 and/or 1003. While the non-limiting method 1100 is described relative to the device 550 of FIG. 5, the device 800 of FIG. 8, and the non-limiting system 100 of FIG. 1, the non-limiting method 1100 can be applicable also to other systems and/or devices described herein. Repetitive description of like elements and/or processes employed in respective embodiments is omitted for sake of brevity.

At 1104, the non-limiting method 1100 can comprise outputting an output current, by a baseband filter (e.g., device 500), that receives an input current, the baseband filter comprising a feedback loop component having an active circuit branch and a passive circuit branch coupled in a loop.

At 1106, the non-limiting method 1100 can comprise coupling the baseband filter to an output stage that is coupled to a quantum processor (e.g., of quantum system 101). The baseband filter and the output stage together can define at least a portion of a radio frequency pulse generator coupled to the quantum processor.

At 1108, the non-limiting method 1100 can comprise outputting, by the system (e.g., quantum system 101), a radio frequency output signal by the radio frequency pulse generator.

At 1110, the non-limiting method 1100 can comprise providing (e.g., via the feedback loop component 502) a pair of poles, that are separable in frequency, by the active circuit branch and the passive circuit branch.

At 1112, the non-limiting method 1100 can comprise operatively coupling, by the system (e.g., quantum system 101), an additional circuit portion between a filter core stage of the baseband filter, and a mirroring stage of the baseband filter.

At 1114, the non-limiting method 1100 can comprise, wherein the providing, by the system (e.g., quantum system 101), an additional pole realized by coupling an additional circuit portion (e.g., additional circuit portion 850) between a filter core stage of the baseband filter, having the feedback loop component, and a mirroring stage of the baseband filter. That is, reference can be made to FIG. 8.

The additional circuit portion can be a non-static power consuming circuit element and can comprise non-static power consuming passive components, such as a resistor and a capacitor.

At 1116, the non-limiting method 1100 can comprise selectively activating, by the system (e.g., quantum system 101), a mirroring device of the baseband filter to vary gain.

At 1118, the non-limiting method 1100 can comprise operatively coupling, by the system (e.g., quantum system 101), the mirroring device to the feedback loop and providing, by the system (e.g., quantum system 101), an output of a current-mode signal path of the baseband filter via the mirroring device.

Figure 13:
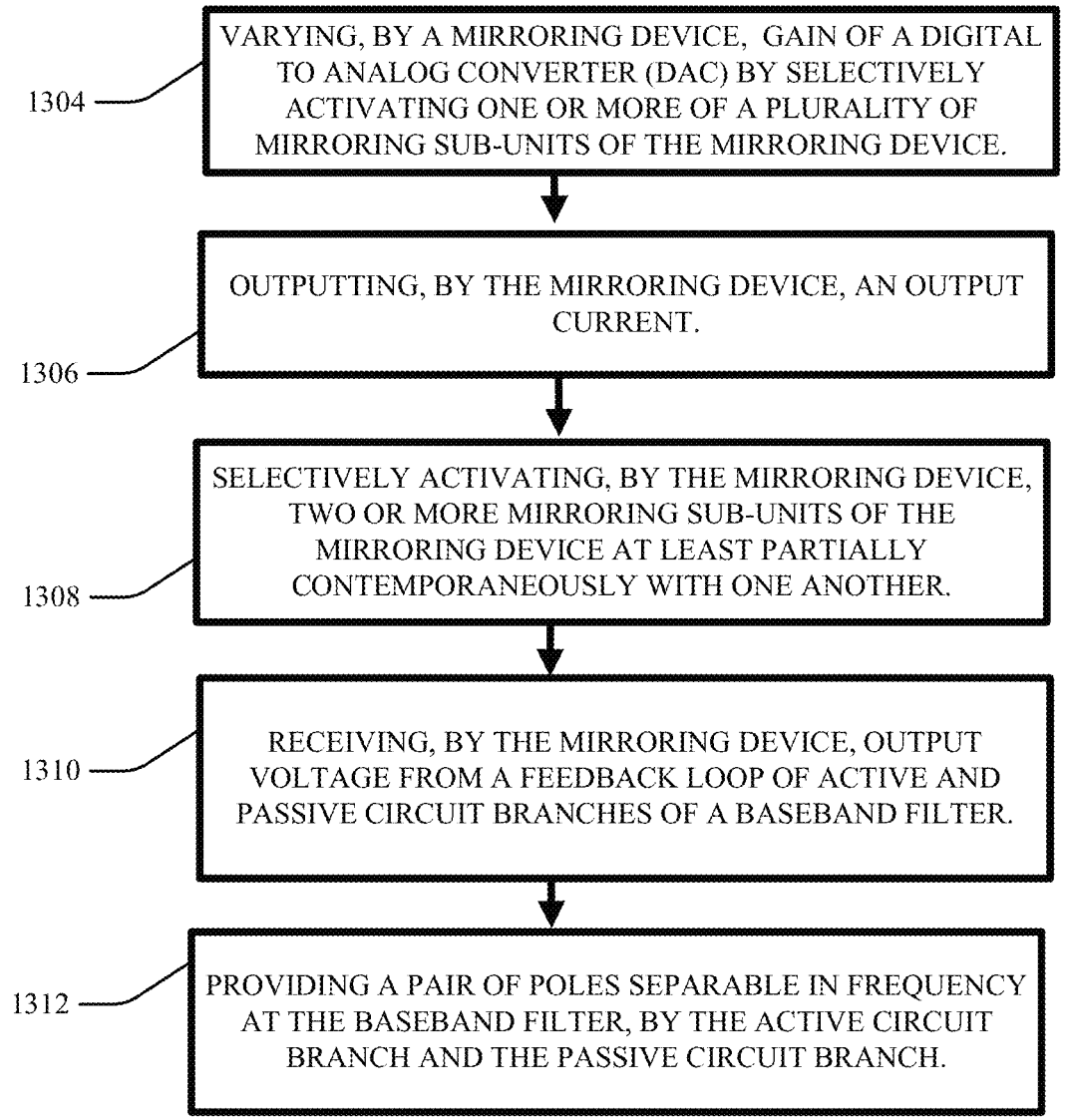
FIG. 13 illustrates a flow diagram of an example, non-limiting method that can facilitate use of a device, in accordance with one or more embodiments described herein.

Next, FIG. 13 illustrates a flow diagram of an example, non-limiting method 1300 that can facilitate a process to use a BBF device in accordance with one or more embodiments described herein, such as the devices 500, 550, 600, 700, 750, 780 and/or 800. While the non-limiting method 1300 is described relative to the device 800 of FIG. 8 and the non-limiting system 100 of FIG. 1, the non-limiting method 1300 can be applicable also to other systems and/or devices described herein. Repetitive description of like elements and/or processes employed in respective embodiments is omitted for sake of brevity.

At 1304, the non-limiting method 1300 can comprise varying gain, by the system (e.g., via a digital controller and/or quantum controller 106) or by a mirroring device, of a digital to analog converter by selectively activating one or more of a plurality of mirroring sub-units of the mirroring device.

At 1306, the non-limiting method 1300 can comprise outputting, by the mirroring device, an output current, wherein the mirroring device can provide an output of a current-mode signal path of a baseband filter.

At 1308, the non-limiting method 1300 can comprise selectively activating, by the mirroring device, at least partially contemporaneously, two or more mirroring sub-units of the mirroring device.

At 1310, the non-limiting method 1300 can comprise receiving, by the mirroring device, output voltage from a feedback loop of active and passive circuit branches of the baseband filter.

At 1312, the non-limiting method 1300 can comprise providing (e.g., via the feedback loop component 802) a pair of poles, that are separable in frequency, by the active circuit branch and the passive circuit branch.

For simplicity of explanation, the computer-implemented and non-computer-implemented methodologies provided herein are depicted and/or described as a series of acts. The subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture to facilitate transporting and transferring the computer-implemented methodologies to computers. The term article of manufacture, as used herein, is intended to encompass a computer program accessible from any computer-readable device or storage media.

In summary, one or more systems, devices and/or methods of use provided herein relate to a baseband filter that can be used in a current-mode end-to-end signal path. The current-mode end-to-end signal path can include a digital to analog converter (DAC) operating in current-mode and an upconverting mixer, operating in current-mode and operatively coupled to the DAC. In one or more embodiments, a device used in the signal path can comprise a baseband filter that receives an input current and outputs an output current. The baseband filter can comprise a feedback loop component having an active circuit branch and a passive circuit branch coupled in a loop. A mirroring device can be coupled to the feedback loop component and can provide an output of the device. Selectively activating the mirroring device can vary gain, such as of the mirroring device.

An advantage of the aforementioned device, system and/or method can be enablement of a current-mode signal path, which can provide a path to current reuse between the baseband filter and adjacent stages in the signal chain. Due to the use of a passive circuit branch that consumes little or no static power, employing the aforementioned feedback loop can reduce current use. Adopting a current-mode signal path limits undesirable distortion products, by avoiding introduction of additional current-to-voltage and voltage-to-current conversions in the respective signal path. Furthermore, construction and function of the baseband filter can align with low impedance at various circuit interfaces of a respective signal path and/or RF pulse generator, which enhances both linearity and circuit bandwidth. In connection therewith, current can be reused, power efficiency can be improved, and distortion products can be reduced, relative to a signal chain employing the baseband filter. Another advantage of current mode filters can be that linear functions such as addition and subtraction can be accomplished by dotting the outputs of circuits together, a technique which is power-efficient and compatible with low supply voltages.

Indeed, various baseband filters described herein, in view of their respective constructions, can receive low impedance current mode input, can provide current source output, and can be power efficient with passive feedback. One or more baseband filters described herein can be used as a transimpedance amplifier/filter. Further, cascading multiple current mode filters as described herein can be seamless.

Additionally, the current-mode BBF embodiments provided herein can offer a path to current reuse and low distortion that can be well-tuned to the requirements of cryogenic waveform generation. One or more embodiments described herein can be suitable for quantum-based applications, such as waveform generation for controlling one or more qubits, such as superconducting qubits. Techniques described herein can be applicable to other high bandwidth communication systems as well and can be implemented in commercially available CMOS technologies. The approaches of one or more exemplary embodiments described herein can provide an innovative strategy for implementing CMOS control pulse generation analog circuits to enable enhanced scalability of future quantum computing systems and can thus serve as a building block for cryo-CMOS implementations.

A benefit of the aforementioned advantages can be an ability to employ less power relative to operating one or more qubits of a quantum system. Reduced power consumption can allow for increased scaling of qubits of a quantum system. Furthermore, the components of the device and/or system can be employed within and/or relative to a cryogenic chamber, such as a dilution refrigerator. Another related advantage can be an ability to achieve a wider range of gain in view of separate varying of sub-units of an employed mirroring device.

Indeed, in view of the one or more embodiments described herein, a practical application of the devices described herein can be reduced power consumption relative to waveforms produced for controlling one or more qubits of a quantum system. Reduced power consumption can, in one or more cases, permit integration of more qubits at the cryogenic temperatures. This is a useful and practical application of computers, especially in view of reduction of noise and/or other effects on reducing decoherence of employed qubits, and thus facilitating enhanced (e.g., improved and/or optimized) operation of the employed qubits. These enhancements can include increased accuracy of quantum results and/or increased availability of the employed qubits. Overall, such computerized tools can constitute a concrete and tangible technical improvement in the field of quantum computing.

Furthermore, one or more embodiments described herein can be employed in a real-world system based on the disclosed teachings. For example, one or more embodiments described herein can function within a quantum system that can receive as input a quantum job request and can measure a real-world qubit state of one or more qubits, such as superconducting qubits, of the quantum system. For example, regarding a DAC device described herein, the DAC device can facilitate waveform generation relative to effecting one or more states of the one or more qubits.

Moreover, a device and/or method described herein can be implemented in one or more domains, such as quantum domains, to enable scaled quantum program executions. Indeed, use of a device as described herein can be scalable, such as where a device described herein can be employed to generate a waveform relative to one or more qubits of a multi-qubit system.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can be, in one or more embodiments, inherently and/or inextricably tied to computer technology and cannot be implemented outside of a computing environment. For example, one or more processes performed by one or more embodiments described herein can more efficiently, and even more feasibly, provide program and/or program instruction execution, such as relative to RF signal generation and/or waveform generation, as compared to existing systems and/or techniques. Systems, computer-implemented methods and/or computer program products facilitating performance of these processes are of great utility in the field of quantum computing and superconducting quantum systems and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively vary gain and/or generate an RF signal and or waveform as the one or more embodiments described herein can facilitate this process. And, neither can the human mind nor a human with pen and paper electronically vary gain and/or generate an RF signal and or waveform, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing the one or more operations described herein.

Figure 14:
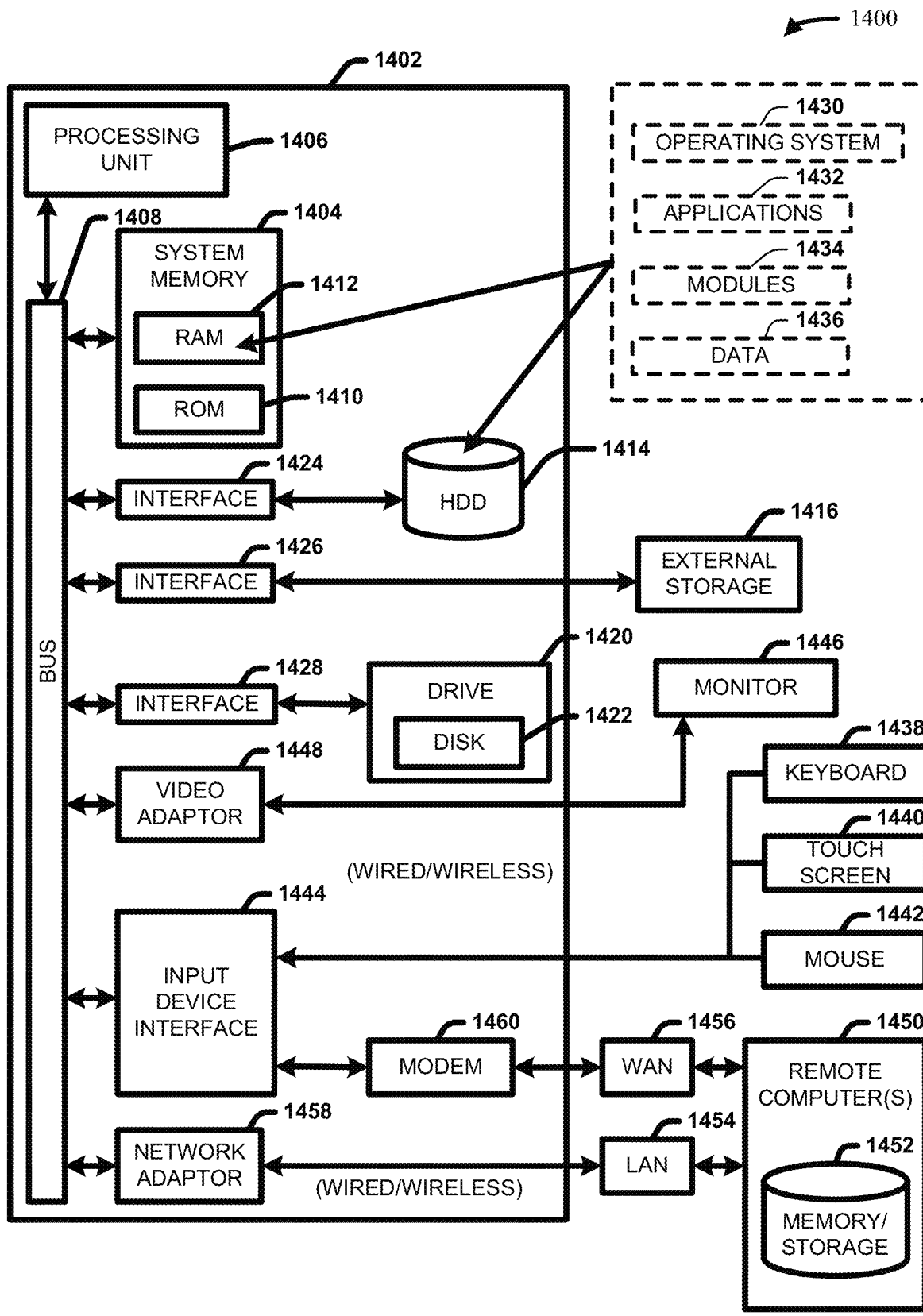
FIG. 14 illustrates a block diagram of an example, non-limiting, operating environment in which one or more embodiments described herein can be facilitated.
Figure 15:
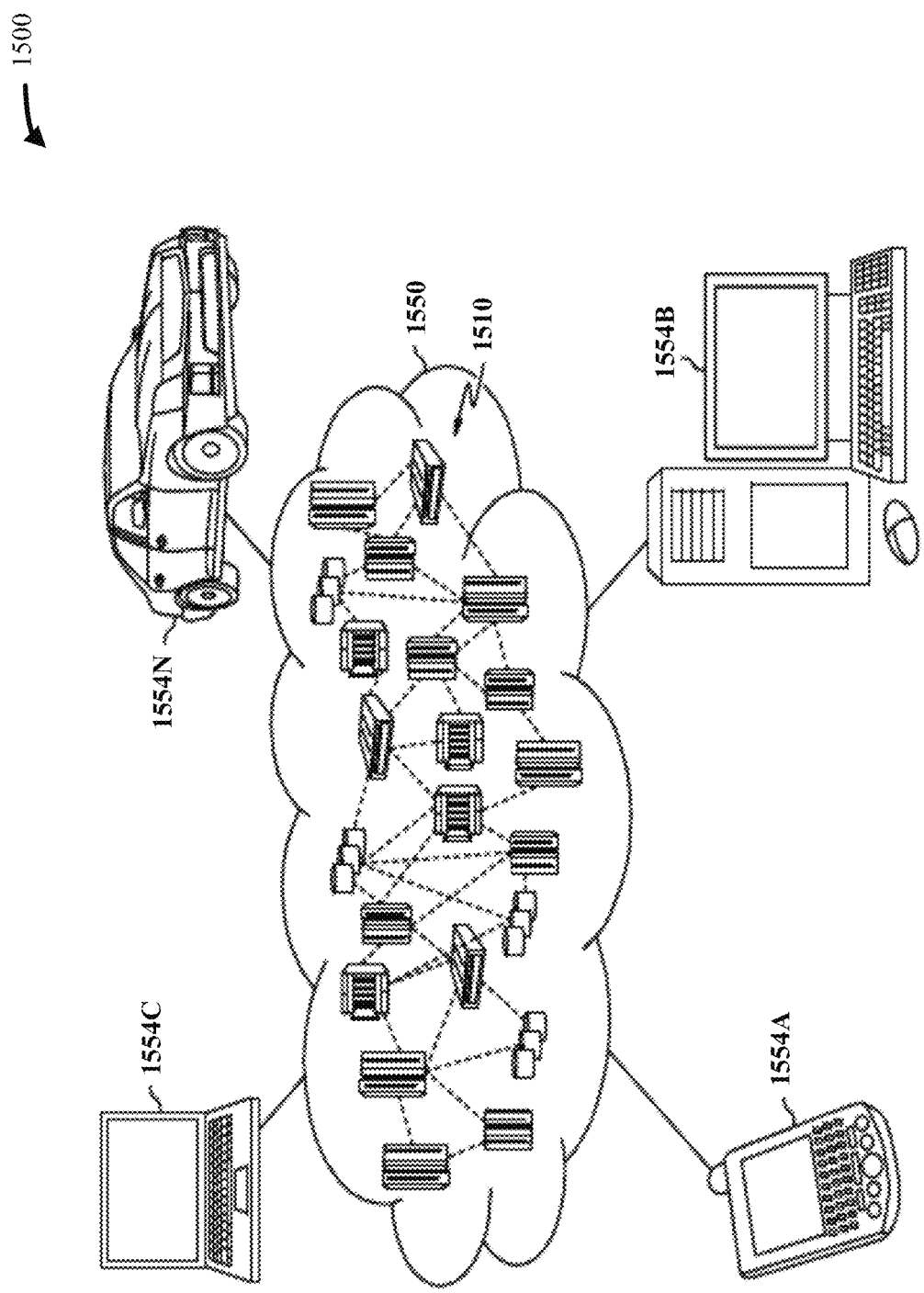
FIG. 15 illustrates a block diagram of an example, non-limiting, cloud computing environment in accordance with one or more embodiments described herein.
Figure 16:
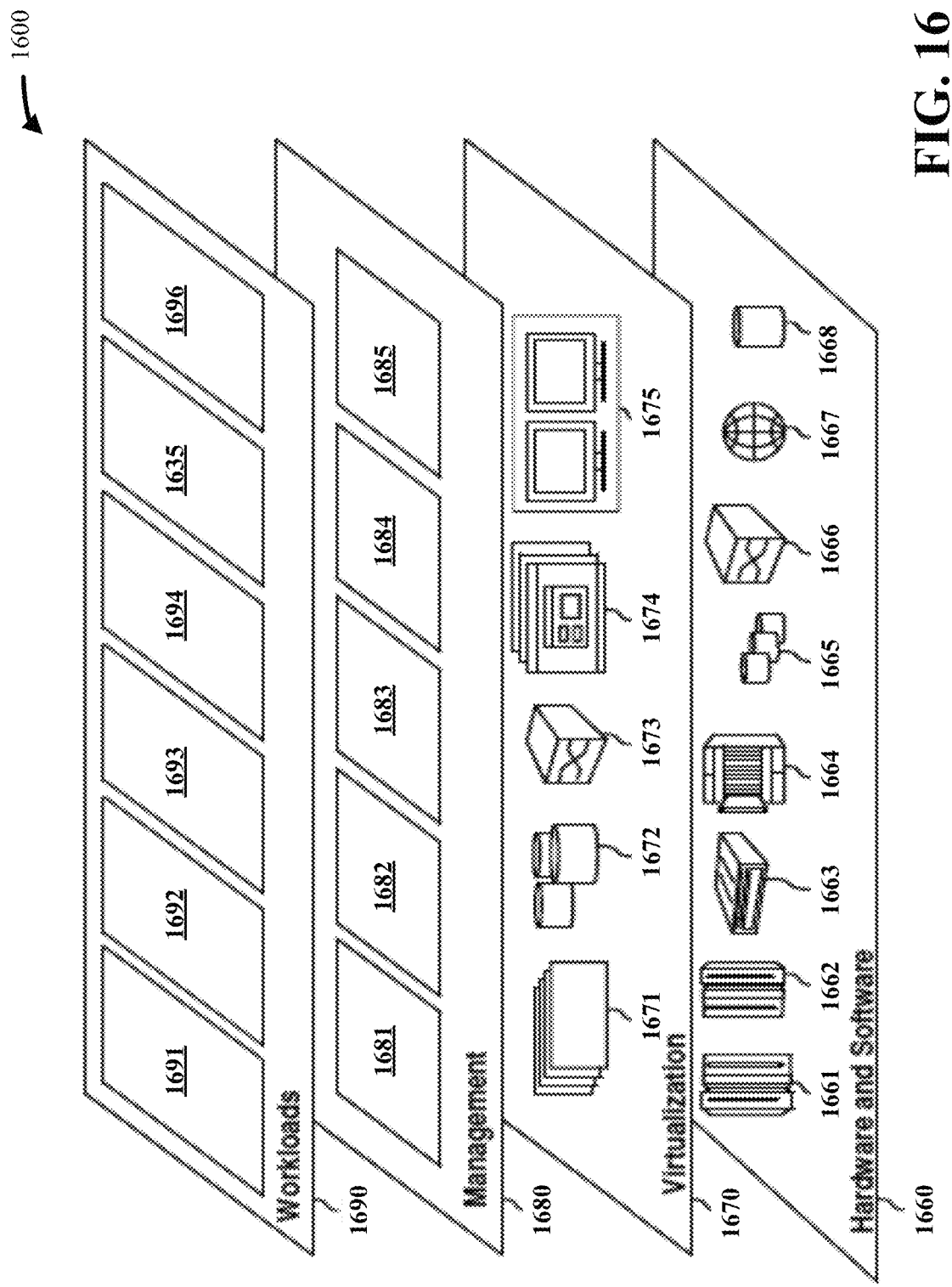
FIG. 16 illustrates a block diagram of example, non-limiting, abstraction model layers in accordance with one or more embodiments described herein.

Turning next to FIGS. 14-16, a detailed description is provided of additional context for the one or more embodiments described herein at FIGS. 1-13.

FIG. 14 and the following discussion are intended to provide a brief, general description of a suitable operating environment 1400 in which one or more embodiments described herein at FIGS. 1-13 can be implemented. For example, one or more components and/or other functions, features and/or elements of embodiments described herein can be implemented in or be associated with, such as accessible via, the operating environment 1400. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the one or more inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set and/or changed in such a manner as to encode information in one or more signals. By way of example, but not limitation, communication media can include wired media, such as a wired network, direct-wired connection and/or wireless media such as acoustic, RF, infrared and/or other wireless media.

With reference again to FIG. 14, the example operating environment 1400 for implementing one or more embodiments described herein can include a computer 1402, the computer 1402 including a processing unit 1406, a system memory 1404 and/or a system bus 1408. One or more structural relationships, functions and/or features of the processing unit 1406 can be applied to processors and/or controllers such as 106 of the non-limiting system 100. The processing unit 1406 can be implemented in combination with and/or alternatively to processors and/or controllers such as 106.

Memory 1404 can store one or more computer and/or machine readable, writable and/or executable components and/or instructions that, when executed by processing unit 1406 (e.g., a classical processor, a quantum processor and/or like processor), can facilitate performance of operations defined by the executable component(s) and/or instruction(s). For example, memory 1404 can store computer and/or machine readable, writable and/or executable components and/or instructions that, when executed by processing unit 1406, can facilitate execution of the one or more functions described herein relating to non-limiting system 100, as described herein with or without reference to the one or more figures of the one or more embodiments.

Memory 1404 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 1406 can comprise one or more types of processors and/or electronic circuitry (e.g., a classical processor, a quantum processor and/or like processor) that can implement one or more computer and/or machine readable, writable and/or executable components and/or instructions that can be stored at memory 1404. For example, processing unit 1406 can perform one or more operations that can be specified by computer and/or machine readable, writable and/or executable components and/or instructions including, but not limited to, logic, control, input/output (I/O), arithmetic and/or the like. In one or more embodiments, processing unit 1406 can be any of one or more commercially available processors. In one or more embodiments, processing unit 1406 can comprise one or more central processing unit, multi-core processor, microprocessor, dual microprocessors, microcontroller, System on a Chip (SOC), array processor, vector processor, quantum processor and/or another type of processor. The examples of processing unit 1406 can be employed to implement one or more embodiments described herein.

The system bus 1408 can couple system components including, but not limited to, the system memory 1404 to the processing unit 1406. The system bus 1408 can comprise one or more types of bus structure that can further interconnect to a memory bus (with or without a memory controller), a peripheral bus and/or a local bus using one or more of a variety of commercially available bus architectures. The system memory 1404 can include ROM 1410 and/or RAM 1412. A basic input/output system (BIOS) can be stored in a non-volatile memory such as ROM, erasable programmable read only memory (EPROM) and/or EEPROM, which BIOS contains the basic routines that help to transfer information among elements within the computer 1402, such as during startup. The RAM 1412 can include a high-speed RAM, such as static RAM for caching data.

The computer 1402 can include an internal hard disk drive (HDD) 1414 (e.g., EIDE, SATA), one or more external storage devices 1416 (e.g., a magnetic floppy disk drive (FDD), a memory stick or flash drive reader, a memory card reader and/or the like) and/or a drive 1420, e.g., such as a solid state drive or an optical disk drive, which can read or write from a disk 1422, such as a CD-ROM disc, a DVD, a BD and/or the like. Additionally, and/or alternatively, where a solid state drive is involved, disk 1422 could not be included, unless separate. While the internal HDD 1414 is illustrated as located within the computer 1402, the internal HDD 1414 can also be configured for external use in a suitable chassis (not shown). Additionally, while not shown in operating environment 1400, a solid state drive (SSD) can be used in addition to, or in place of, an HDD 1414. The HDD 1414, external storage device(s) 1416 and drive 1420 can be coupled to the system bus 1408 by an HDD interface 1424, an external storage interface 1426 and a drive interface 1428, respectively. The HDD interface 1424 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1402, the drives and storage media accommodate the storage of any data in a suitable digital format. Although the description of computer-readable storage media above refers to respective types of storage devices, other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 1412, including an operating system 1430, one or more applications 1432, other program modules 1434 and/or program data 1436. All or portions of the operating system, applications, modules and/or data can also be cached in the RAM 1412. The systems and/or methods described herein can be implemented utilizing one or more commercially available operating systems and/or combinations of operating systems.

Computer 1402 can optionally comprise emulation technologies. For example, a hypervisor (not shown) or other intermediary can emulate a hardware environment for operating system 1430, and the emulated hardware can optionally be different from the hardware illustrated in FIG. 14. In a related embodiment, operating system 1430 can comprise one virtual machine (VM) of multiple VMs hosted at computer 1402. Furthermore, operating system 1430 can provide runtime environments, such as the JAVA runtime environment or the .NET framework, for applications 1432. Runtime environments are consistent execution environments that can allow applications 1432 to run on any operating system that includes the runtime environment. Similarly, operating system 1430 can support containers, and applications 1432 can be in the form of containers, which are lightweight, standalone, executable packages of software that include, e.g., code, runtime, system tools, system libraries and/or settings for an application.

Further, computer 1402 can be enabled with a security module, such as a trusted processing module (TPM). For instance, with a TPM, boot components hash next in time boot components and wait for a match of results to secured values before loading a next boot component. This process can take place at any layer in the code execution stack of computer 1402, e.g., applied at application execution level and/or at operating system (OS) kernel level, thereby enabling security at any level of code execution.

An entity can enter and/or transmit commands and/or information into the computer 1402 through one or more wired/wireless input devices, e.g., a keyboard 1438, a touch screen 1440 and/or a pointing device, such as a mouse 1442. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint and/or iris scanner, and/or the like. These and other input devices can be coupled to the processing unit 1406 through an input device interface 1444 that can be coupled to the system bus 1408, but can be coupled by other interfaces, such as a parallel port, an IEEE 1394 serial port, a game port, a USB port, an IR interface, a BLUETOOTH® interface and/or the like.

A monitor 1446 or other type of display device can be alternatively and/or additionally coupled to the system bus 1408 via an interface, such as a video adapter 1448. In addition to the monitor 1446, a computer typically includes other peripheral output devices (not shown), such as speakers, printers and/or the like.

The computer 1402 can operate in a networked environment using logical connections via wired and/or wireless communications to one or more remote computers, such as a remote computer(s) 1450. The remote computer(s) 1450 can be a workstation, a server computer, a router, a personal computer, portable computer, microprocessor-based entertainment appliance, a peer device and/or other common network node, and typically includes many or all of the elements described relative to the computer 1402, although, for purposes of brevity, only a memory/storage device 1452 is illustrated. Additionally, and/or alternatively, the computer 1402 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 1454 and/or larger networks, e.g., a wide area network (WAN) 1456. LAN and WAN networking environments can be commonplace in offices and companies and can facilitate enterprise-wide computer networks, such as intranets, all of which can connect to a global communications network, e.g., the Internet.

When used in a LAN networking environment, the computer 1402 can be coupled to the local network 1454 through a wired and/or wireless communication network interface or adapter 1458. The adapter 1458 can facilitate wired and/or wireless communication to the LAN 1454, which can also include a wireless access point (AP) disposed thereon for communicating with the adapter 1458 in a wireless mode.

When used in a WAN networking environment, the computer 1402 can include a modem 1460 and/or can be coupled to a communications server on the WAN 1456 via other means for establishing communications over the WAN 1456, such as by way of the Internet. The modem 1460, which can be internal and/or external and a wired and/or wireless device, can be coupled to the system bus 1408 via the input device interface 1444. In a networked environment, program modules depicted relative to the computer 1402 or portions thereof can be stored in the remote memory/storage device 1452. The network connections shown are merely exemplary and one or more other means of establishing a communications link among the computers can be used.

When used in either a LAN or WAN networking environment, the computer 1402 can access cloud storage systems or other network-based storage systems in addition to, and/or in place of, external storage devices 1416 as described above, such as but not limited to, a network virtual machine providing one or more aspects of storage and/or processing of information. Generally, a connection between the computer 1402 and a cloud storage system can be established over a LAN 1454 or WAN 1456 e.g., by the adapter 1458 or modem 1460, respectively. Upon coupling the computer 1402 to an associated cloud storage system, the external storage interface 1426 can, such as with the aid of the adapter 1458 and/or modem 1460, manage storage provided by the cloud storage system as it would other types of external storage. For instance, the external storage interface 1426 can be configured to provide access to cloud storage sources as if those sources were physically coupled to the computer 1402.

The computer 1402 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a predefined structure as with a conventional network or simply an ad hoc communication between at least two devices.

The illustrated embodiments described herein can be employed relative to distributed computing environments (e.g., cloud computing environments), such as described below with respect to FIG. 15, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 1550 described below with reference to FIG. 15, and/or with reference to the one or more functional abstraction layers (e.g., quantum software and/or the like) described below with reference to FIG. 16, to execute one or more operations in accordance with one or more embodiments described herein. For example, cloud computing environment 1550 and/or one or more of the functional abstraction layers 1660, 1670, 1680 and/or 1690 can comprise one or more classical computing devices (e.g., classical computer, classical processor, virtual machine, server and/or the like), quantum hardware and/or quantum software (e.g., quantum computing device, quantum computer, quantum processor, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting system 100 and/or the example operating environment 1400 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting system 100 and/or example operating environment 1400 can be employed to use hardware and/or software to solve problems that are highly technical in nature, that are not abstract and/or that cannot be performed as a set of mental acts by a human.

Referring now to details of one or more elements illustrated at FIG. 15, the illustrative cloud computing environment 1550 is depicted. As shown, cloud computing environment 1550 includes one or more cloud computing nodes 1510 with which local computing devices used by cloud consumers, such as, for example, personal digital assistant (PDA) or cellular telephone 1554A, desktop computer 1554B, laptop computer 1554C and/or automobile computer system 1554N can communicate. Although not illustrated in FIG. 15, cloud computing nodes 1510 can further comprise a quantum platform (e.g., quantum computer, quantum hardware, quantum software and/or the like) with which local computing devices used by cloud consumers can communicate. Cloud computing nodes 1510 can communicate with one another. They can be grouped (not shown) physically or virtually, in one or more networks, such as Private, Community, Public, or Hybrid clouds as described hereinabove, or a combination thereof. This allows cloud computing environment 1550 to offer infrastructure, platforms and/or software as services for which a cloud consumer does not need to maintain resources on a local computing device. It is understood that the types of computing devices 1554A-N shown in FIG. 15 are intended to be illustrative only and that cloud computing nodes 1510 and cloud computing environment 1550 can communicate with any type of computerized device over any type of network and/or network addressable connection (e.g., using a web browser).

Referring now to details of one or more elements illustrated at FIG. 16, a set 1600 of functional abstraction layers is shown, such as provided by cloud computing environment 1550 (FIG. 15). One or more embodiments described herein can be associated with, such as accessible via, one or more functional abstraction layers described below with reference to FIG. 16 (e.g., hardware and software layer 1660, virtualization layer 1670, management layer 1680 and/or workloads layer 1690). It should be understood in advance that the components, layers and/or functions shown in FIG. 16 are intended to be illustrative only and embodiments described herein are not limited thereto. As depicted, the following layers and/or corresponding functions are provided:

Hardware and software layer 1660 can include hardware and software components. Examples of hardware components include: mainframes 1661; RISC (Reduced Instruction Set Computer) architecture-based servers 1662; servers 1663; blade servers 1664; storage devices 1665; and/or networks and/or networking components 1666. In one or more embodiments, software components can include network application server software 1667, quantum platform routing software 1668; and/or quantum software (not illustrated in FIG. 16).

Virtualization layer 1670 can provide an abstraction layer from which the following examples of virtual entities can be provided: virtual servers 1671; virtual storage 1672; virtual networks 1673, including virtual private networks; virtual applications and/or operating systems 1674; and/or virtual clients 1675.

In one example, management layer 1680 can provide the functions described below. Resource provisioning 1681 can provide dynamic procurement of computing resources and other resources that can be utilized to perform tasks within the cloud computing environment. Metering and Pricing 1682 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1683 can provide access to the cloud computing environment for consumers and system administrators. Service level management 1684 can provide cloud computing resource allocation and/or management such that required service levels are met. Service Level Agreement (SLA) planning and fulfillment 1685 can provide pre-arrangement for, and procurement of, cloud computing resources for which a future requirement is anticipated in accordance with an SLA.

Workloads layer 1690 can provide examples of functionality for which the cloud computing environment can be utilized. Non-limiting examples of workloads and functions which can be provided from this layer include: mapping and navigation 1691; software development and lifecycle management 1692; virtual classroom education delivery 1693; data analytics processing 1694; transaction processing 1695; and/or application transformation software 1696.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out features and/or functions of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be coupled to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform features and/or functions of the one or more embodiments described herein.

One or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, the inventive computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated elements, components and/or the like can also be practiced in distributed computing environments in which tasks are performed by remote processing devices that are linked through a communications network. However, one or more, if not all components, elements, functions and/or features of the one or more embodiments described herein can be practiced on stand-alone computers. In a distributed computing environment, program modules can be located in both local and remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In one embodiment, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A device, comprising:
    a baseband filter that receives an input current and outputs an output current, the baseband filter comprising:
        a feedback loop component having an active circuit branch and a passive circuit branch coupled in a loop, wherein the active circuit branch comprises a first transistor and a second transistor, wherein the passive circuit branch comprises a first resistor coupled to a drain of the second transistor, and a first capacitor coupled to a gate of the first transistor;
        a mirroring device; and
        an additional circuit portion coupled between the feedback loop component and the mirroring device, wherein the additional circuit portion comprises a second resistor and a second capacitor coupled to the gate of the first transistor and coupled to a gate of a third transistor of the mirroring device.

2. The device of claim 1, wherein the active circuit branch and the passive circuit branch together provide a pair of poles separable in frequency.

3. The device of claim 2, wherein the additional circuit portion provides an additional pole.

4. The device of claim 1, wherein a drain of the first transistor is coupled to a source of the second transistor.

5. The device of claim 1, wherein the mirroring device provides an output of the device.

6. The device of claim 1, wherein the mirroring device comprises a plurality of transistors, wherein the plurality of transistors comprises the third transistor.

7. The device of claim 6, wherein the mirroring device varies gain of the device by selectively activating transistors of the plurality of transistors of the mirroring device.

8. A system, comprising:
    a radio frequency pulse generator comprising:
        a baseband filter that receives an input current and provides an output current, wherein the baseband filter comprises:
            a feedback loop component having an active circuit branch and a passive circuit branch coupled in a loop, wherein the active circuit branch comprises a first transistor and a second transistor, wherein the passive circuit branch comprises a first resistor coupled to a drain of the second transistor, and a first capacitor coupled to a gate of the first transistor; and
        an output stage coupled to the baseband filter, wherein the output stage comprises:
            a mirroring device; and
            an additional circuit portion coupled between the feedback loop component and the mirroring device, wherein the additional circuit portion comprises a second resistor and a second capacitor coupled to the gate of the first transistor and coupled to a gate of a third transistor of the mirroring device.

9. The system of claim 8, wherein a drain of the first transistor is coupled to a source of the second transistor.

10. The system of claim 8, wherein the active circuit branch and the passive circuit branch together provide a pair of poles separable in frequency.

11. The system of claim 10, wherein the additional circuit portion provides an additional pole.

12. The system of claim 8, wherein the mirroring device comprises a plurality of transistors, wherein the plurality of transistors comprises the third transistor.

13. The system of claim 12, wherein the mirroring device varies gain of the radio frequency pulse generator by selectively activating transistors of the plurality of transistors of the mirroring device.

14. A method, comprising:
    outputting, by a device, an output current, via a baseband filter of the device that receives an input current, wherein the baseband filter comprises:
        a feedback loop component having an active circuit branch and a passive circuit branch coupled in a loop, wherein the active circuit branch comprises a first transistor and a second transistor, wherein the passive circuit branch comprises a first resistor coupled to a drain of the second transistor, and a first capacitor coupled to a gate of the first transistor; and
        an additional circuit portion coupled between the feedback loop component and a mirroring stage of the device, wherein the additional circuit portion comprises a second resistor and a second capacitor coupled to the gate of the first transistor and coupled to a gate of a third transistor of the mirroring stage.

15. The method of claim 14, further comprising:
    operatively coupling, by the device, the baseband filter to an output stage of the device, wherein the output stage comprises the mirroring stage, and wherein the baseband filter and the output stage together define at least a portion of a radio frequency pulse generator.

16. The method of claim 15, further comprising:
    outputting, by the device, a radio frequency output signal by the radio frequency pulse generator.

17. The method of claim 14, further comprising:
    providing, by the active circuit branch and the passive circuit branch of the baseband filter of the device, a pair of poles that are separable in frequency; and
    wherein the additional circuit portion provides an additional pole.

18. The method of claim 17, wherein the additional circuit portion is a non-static power consuming circuit element.

19. The method of claim 14, wherein the passive circuit branch is a non-static power consuming circuit branch.

20. The method of claim 14, further comprising:
    selectively activating, by the device, the mirroring stage to vary gain, wherein the mirroring stage provides an output of a current-mode signal path of the baseband filter.

21. A device, comprising:
    a baseband filter that outputs an output current based on an input current, the baseband filter comprising:
        an active branch comprising:
            a first transistor having a source, a gate and a drain, wherein the source is coupled to an input terminal, wherein the gate is coupled to a bias voltage, wherein the drain is coupled to a capacitance source, and wherein the capacitance source provides a first pole; and a second transistor;

a passive branch coupled in a loop with the active branch, wherein the passive branch couples the drain of the first transistor to a gate of the second transistor, and wherein the passive branch comprises a first resistor and a first capacitor, and provides a second pole;

a mirroring device; and an additional circuit portion that comprises a second resistor and a second capacitor coupled to the gate of the first transistor and coupled to a gate of a third transistor of the mirroring device.

22. The device of claim 21, wherein a source of the second transistor is coupled to ground or to a power supply, and wherein a drain of the second transistor is coupled to the input terminal.

23. The device of claim 21, wherein the third transistor is operable as a bias current source.

24. A device, comprising:

a plurality of baseband filters coupled in series, where at least two baseband filters of the plurality of baseband filters respectively comprise:

a feedback loop component having an active circuit branch and a passive circuit branch coupled in a loop, wherein the active circuit branch comprises a first transistor and a second transistor, wherein the passive circuit branch comprises a first resistor coupled to a drain of the second transistor, and a first capacitor coupled to a gate of the first transistor;

a mirroring device; and an additional circuit portion coupled between the feedback loop component and the mirroring device, wherein the additional circuit portion comprises a second resistor and a second capacitor coupled to the gate of the first transistor and coupled to a gate of a third transistor of the mirroring device.

25. The device of claim 24, wherein the active circuit branch and the passive circuit branch together provide a pair of poles separable in frequency.

* * * * *